United States Patent
Honjo et al.

(10) Patent No.: US 11,770,981 B2
(45) Date of Patent: Sep. 26, 2023

(54) MAGNETORESISTIVE ELEMENT AND MAGNETIC MEMORY

(71) Applicant: TOHOKU UNIVERSITY, Sendai (JP)

(72) Inventors: Hiroaki Honjo, Sendai (JP); Tetsuo Endoh, Sendai (JP); Shoji Ikeda, Sendai (JP); Hideo Sato, Sendai (JP); Koichi Nishioka, Sendai (JP)

(73) Assignee: TOHOKU UNIVERSITY, Sendai (JP)

( * ) Notice: Subject to any disclaimer, the term of this patent is extended or adjusted under 35 U.S.C. 154(b) by 622 days.

(21) Appl. No.: 17/043,404

(22) PCT Filed: Feb. 19, 2019

(86) PCT No.: PCT/JP2019/006150
§ 371 (c)(1),
(2) Date: Dec. 18, 2020

(87) PCT Pub. No.: WO2019/187800
PCT Pub. Date: Oct. 3, 2019

(65) Prior Publication Data
US 2021/0135094 A1 May 6, 2021

(30) Foreign Application Priority Data
Mar. 30, 2018 (JP) .................... 2018-070399

(51) Int. Cl.
*H10N 50/80* (2023.01)
*H10B 61/00* (2023.01)
*H10N 50/85* (2023.01)

(52) U.S. Cl.
CPC .......... *H10N 50/80* (2023.02); *H10B 61/00* (2023.02); *H10N 50/85* (2023.02)

(58) Field of Classification Search
CPC ......... H10N 50/80; H10N 50/85; H10B 61/00
(Continued)

(56) References Cited

U.S. PATENT DOCUMENTS

2007/0086121 A1  4/2007 Nagase et al.
2012/0139069 A1  6/2012 Kim et al.
(Continued)

FOREIGN PATENT DOCUMENTS

JP   2007142364 A   6/2007
JP   2012124491 A   6/2012
(Continued)

OTHER PUBLICATIONS

Ikeda, S., et al., A Perpendicular-Anisotropy CoFeB—MgO Magnetic Tunnel Junction, Nature Matter, 2010, 9, pp. 721-724.
(Continued)

*Primary Examiner* — Igwe U Anya
(74) *Attorney, Agent, or Firm* — Procopio, Cory, Hargreaves Savitch LLP

(57) ABSTRACT

Provided are a magnetoresistance effect element and a magnetic memory having a shape magnetic anisotropy and using a recording layer having an anti-parallel coupling.

A first magnetic layer (3) and a second magnetic layer (5) of the magnetoresistance effect element include a ferromagnetic substance, have a magnetization direction variable to the direction perpendicular to a film surface and are magnetically coupled in an anti-parallel direction, and a junction size D (nm), which is a length of the longest straight line on an end face perpendicular to the thickness direction of the first magnetic layer (3) and the second magnetic layer (5), a film thickness $t_1$ (nm) of the first magnetic layer (3), and a film thickness $t_2$ (nm) of the second magnetic layer (5) satisfy relationships $D<t_1$ and $D\leq t_1$ or $D\leq t_1$ and $D<t_2$.

12 Claims, 22 Drawing Sheets

(58) Field of Classification Search
USPC .......................................................... 257/421
See application file for complete search history.

(56) References Cited

U.S. PATENT DOCUMENTS

| | | |
|---|---|---|
| 2012/0244639 A1 | 9/2012 | Ohsawa et al. |
| 2015/0171316 A1 | 6/2015 | Park et al. |
| 2016/0233416 A1* | 8/2016 | Ikeda ..................... H10N 50/10 |
| 2018/0053521 A1 | 2/2018 | Yamane et al. |
| 2018/0175286 A1 | 6/2018 | Sato et al. |
| 2019/0019944 A1* | 1/2019 | Sato ..................... G11C 11/1695 |
| 2019/0304526 A1 | 10/2019 | Honjo et al. |
| 2020/0044142 A1 | 2/2020 | Honjo et al. |

FOREIGN PATENT DOCUMENTS

| | | |
|---|---|---|
| JP | 2012199431 A | 10/2012 |
| JP | 2017505533 A | 2/2017 |
| WO | 2010137679 A1 | 12/2010 |
| WO | 2015060239 A1 | 4/2015 |
| WO | 2016139878 A1 | 9/2016 |
| WO | 2017010549 A1 | 1/2017 |
| WO | 2017212895 A1 | 12/2017 |
| WO | 2018134929 A1 | 11/2019 |

OTHER PUBLICATIONS

Sato, H., MgO/CoFeB/Ta/CoFeB/MgO Recording Structure in Magnetic Tunnel Junctions with Perpendicular Easy Axis, IEEE Transactions on Magnetics, 49(7), Jul. 2013, pp. 4437-4440.
International Search Report and Written Opinion for related PCT App No. PCT/JP2019/006150 dated May 7, 2019, 8 pgs. (partial translation).
International Preliminary Report on Patentability for related PCT App No. PCT/JP2019/006150 dated May 12, 2020, 22 pgs.

* cited by examiner

MAGNETORESISTIVE ELEMENT AND MAGNETIC MEMORY

CROSS-REFERENCE TO RELATED APPLICATIONS

This application is a U.S. National Stage entry of PCT Application No: PCT/JP2019/006150 filed Feb. 19, 2019, which claims priority to Japanese Patent Application No. 2018-070399 filed Mar. 30, 2018, the contents of which are incorporated herein by reference.

TECHNICAL FIELD

The present invention relates to a magnetoresistance effect element and a magnetic memory. In particular, the present invention relates to a magnetoresistance effect element having a shape magnetic anisotropy in a perpendicular direction with respect to a substrate surface.

BACKGROUND ART

An MRAM (Magnetic Random Access Memory; magnetic memory) is a non-volatile memory using an MTJ (Magnetic Tunnel Junction).

The MRAM, which does not consume power during standby, has high-speed operation and high write resistance and which can be miniaturized to 10 nm or less, attracts attention as a next-generation memory and a logic integrated circuit.

The MRAM includes a magnetic memory cell having a structure in which a selection transistor and a magnetoresistance effect element are electrically connected in series.

A source electrode of the selected transistor is electrically connected to a source line, a drain electrode is electrically connected to a bit line via the magnetoresistance effect element, and a gate electrode is electrically connected to a word line.

The magnetoresistance effect element is based on a structure in which a non-magnetic layer (tunnel barrier layer) is sandwiched between magnetic layers (reference layer, recording layer) including two ferromagnetic substances. One of the magnetic layers is a reference layer in which the magnetization direction is fixed, and the other one of the magnetic layers is a recording layer in which the magnetization direction is variable.

The resistance value of the magnetoresistance effect element decreases when the magnetization direction of the magnetic layer of the reference layer and the magnetization direction of the magnetic layer of the recording layer are arranged in parallel, and increases when the magnetization directions are arranged in anti-parallel. A magnetic memory cell of the MRAM assigns these two resistance states to bit information "0" and "1".

Main characteristics required for MRAM are (i) large tunnel magnetoresistance ratio (TMR ratio) of the magnetoresistance effect element, (ii) small write current $I_C$, (iii) large thermal stability factor $\Delta$, and (iv) small element size (miniaturization). The (i) is a characteristic needed for reading at high speed, the (ii) is a characteristic needed for writing at high speed, the (iii) is a characteristic needed for non-volatility of magnetic memory, and the (iv) is a characteristic needed for high integration of MRAM.

The present inventors have developed a tunnel magnetic junction that mainly utilizes interface magnetic anisotropy, and have established a number of techniques for miniaturizing magnetoresistance effect elements that have the above characteristics improved from various perspectives (NPL 1, 2, PTL 1, and many others.).

CITATION LIST

Non Patent Literature

[NPL 1] S. Ikeda, K. Miura, H. Yamamoto, K. Mizunuma, H. D. Gan, M. Endo, S. Kanai, F. Matsukura, and H. Ohno, "A perpendicular-anisotropy CoFeB-MgO magnetic tunnel junction", Nature Mater., 2010, 9, 721.

[NPL 2] H. Sato, M. Yamanouchi, S. Ikeda, S. Fukami, F. Matsukura, and H. Ohno, "MgO/CoFeB/Ta/CoFeB/MgO recording structure in magnetic tunnel junctions with perpendicular easy axis", IEEE Trans. Magn., 2013, 49, 4437.

Patent Literature

[PTL 1] International Patent Application No. PCT/JP2017/001617.

SUMMARY OF INVENTION

Problems to be Solved by the Invention

In order to implement a large-capacity magnetic memory that is highly integrated by miniaturization, non-volatility is needed such that recorded bit information is retained for 10 years or more. Therefore, the recording layer of the ferromagnetic substance is required to have a thermal stability factor $\Delta$ of 70 or more.

However, as described above, the value of the thermal stability factor needs to be 70 or more as a unit memory, but the value does not necessarily have to be 70 or more when used as a DRAM substitute or SRAM substitute, and may be less than this.

NPL 1 discloses that a magnetoresistance effect element with a thermal stability factor $\Delta$ of about 40 at a junction size diameter of 40 nm in a magnetic layer of a recording layer is obtained.

Further, NPL 2 discloses a double CoFeB/MgO interface recording structure in which the thermal stability factor $\Delta$ is 80 or more when the junction size diameter of the recording layer is in the 40 nm range, and the thermal stability factor $\Delta$ is about 59 when the junction size diameter is 29 nm.

Also, it is known that when the element size spacing is about 15 nm or less, the write current density increases and thermal stability decreases due to the influence of stray magnetic field from an adjacent element. For example, when a magnetoresistance effect element, in which intrinsically the magnetization direction has to be a direction perpendicular to a film surface, receives the stray magnetic field of an adjacent magnetoresistance effect element, and in a case where the stray magnetic field is anti-parallel (opposite orientations), thermal disturbance is caused such that the magnetization direction of the magnetoresistance effect element that is intrinsically a direction perpendicular to a film surface is tilted, etc. Conversely, in a case where the stray magnetic field is parallel (same orientation), an adverse effect is elicited such that the writing current of the magnetoresistance effect element in which the magnetization direction is intrinsically a direction perpendicular to u film surface needs to be increased.

In other words, in order to implement a large-capacity magnetic memory that is highly integrated by miniaturization, it is necessary to further improve thermal stability of the magnetoresistance effect element at a smaller junction size and reduce the stray magnetic field from the element.

In view of the above, a magnetoresistance effect element and a magnetic memory having a shape magnetic anisotropy and using a recording layer having an anti-parallel coupling have been found, and the present invention has been completed base on the finding.

Solution to Problem

In order to solve the above problems, the magnetoresistance effect element of the present invention includes: a first reference layer (B1); a first non-magnetic layer (2) provided adjacent to the first reference layer (B1); a first magnetic layer (3) provided adjacent to an opposite side of the first non-magnetic layer (2) to the first reference layer (B1); a non-magnetic coupling layer (4) provided adjacent to an opposite side of the first magnetic layer (3) to the first non-magnetic layer (2); a second magnetic layer (5) provided adjacent to an opposite side of the non-magnetic coupling layer (4) to the first magnetic layer (3); and a second non-magnetic layer (6) provided adjacent to an opposite side of the second magnetic layer (5) to the non-magnetic coupling layer (4), wherein the first reference layer (B1) includes a ferromagnetic substance and has a magnetization direction fixed to a direction perpendicular to a film surface, the first magnetic layer (3) and the second magnetic layer (5) each include a ferromagnetic substance, have a magnetization direction variable to the direction perpendicular to a film surface and are magnetically coupled in an anti-parallel direction, and a junction size D (nm), which is a length of the longest straight line on an end face perpendicular to each thickness direction of the first magnetic layer (3) and the second magnetic layer (5), a film thickness $t_1$ (nm) of the first magnetic layer (3), and a film thickness $t_2$ (nm) of the second magnetic layer (5) satisfy relationships $D<t_1$ and $D\leq t_2$ or $D\leq t_1$ and $D<t_2$.

The magnetoresistance effect element may further include a second reference layer (B2) provided adjacent to an opposite side of the second non-magnetic layer (6) to the second magnetic layer (5), the second reference layer (B2) may include a ferromagnetic substance and have the magnetization direction fixed to the direction perpendicular to a film surface, and the magnetization direction of the first reference layer (B1) and the magnetization direction of the second reference layer (B2) may be opposite to each other.

The first non-magnetic layer (2) and the second non-magnetic layer (6) each may include O.

The non-magnetic coupling layer (4) may include any one or more of Ru, Cu, Ir, Pd, Ta, W, or alloys thereof.

The junction size D may be 40 nm or less.

The film thickness $t_1$ (nm) of the first magnetic layer (3) and the film thickness $t_2$ (nm) of the second magnetic layer (5) may be 15 nm or less.

The film thickness of the first non-magnetic layer (2) and the film thickness of the second non-magnetic layer (6) may be different.

In another possible configuration, the first magnetic layer (3) includes a first divided magnetic layer (3a), a first non-magnetic insertion layer (3b), and a second divided magnetic layer (3c), the first divided magnetic layer (3a) being provided adjacent to the first non-magnetic layer (2) and the first non-magnetic insertion layer (3b), the first non-magnetic insertion layer (3b) being provided adjacent to the first divided magnetic layer (3a) and the second divided magnetic layer (3c), and the second divided magnetic layer (3c) being provided adjacent to the first non-magnetic insertion layer (3b) and the non-magnetic coupling layer (4); the second magnetic layer (5) includes a third divided magnetic layer (5a), a second non-magnetic insertion layer (5b), and a fourth divided magnetic layer (5c), the third divided magnetic layer (5a) being provided adjacent to the non-magnetic coupling layer (4) and the second non-magnetic insertion layer (5b), the second non-magnetic insertion layer (5b) being provided adjacent to the third divided magnetic layer (5a) and the fourth divided magnetic layer (5c), and the fourth divided magnetic layer (5c) being provided adjacent to the second non-magnetic insertion layer (5b) and the second non-magnetic layer (6); the first divided magnetic layer (3a), the second divided magnetic layer (3c), the third divided magnetic layer (5a), and the fourth divided magnetic layer (5c) include at least any of Co and Fe; the first divided magnetic layer (3a) and the second divided magnetic layer (3c) are magnetically coupled in a parallel direction; the third divided magnetic layer (5a) and the fourth divided magnetic layer (5c) are magnetically coupled in a parallel direction; and the second divided magnetic layer (3c) and the third divided magnetic layer (5a) are magnetically coupled in an anti-parallel direction.

A ratio of an Fe composition of the first divided magnetic layer (3a) to an Fe composition of the second divided magnetic layer (3c) is greater than 1, or a ratio of a Co composition of the first divided magnetic layer (3a) to a Co composition of the second divided magnetic layer (3c) is less than 1, and a ratio of an Fe composition of the fourth divided magnetic layer (5c) to an Fe composition of the third divided magnetic layer (5a) is greater than 1, or a ratio of a Co composition of the fourth divided magnetic layer (5c) to a Co composition of the third divided magnetic layer (5a) is less than 1.

A non-magnetic film (8) may be included in a peripheral part of each of the first magnetic layer (3), the non-magnetic coupling layer (4), and the second magnetic layer (5).

A side wall (9) may be further provided on a periphery of the first reference layer (B1).

The magnetic memory of the present invention includes the magnetoresistance effect element.

Advantageous Effects of the Invention

According to the present invention, it is possible to provide a magntoresistance effect element and magnetic memory having a high thermal stability factor Δ even at a fine junction size. Further, it is possible to provide a magnetoresistance effect element and magnetic memory in which the stray magnetic field is small and which are unlikely to be affected by the stray magnetic field.

DESCRIPTION OF EMBODIMENTS

Figure 1:
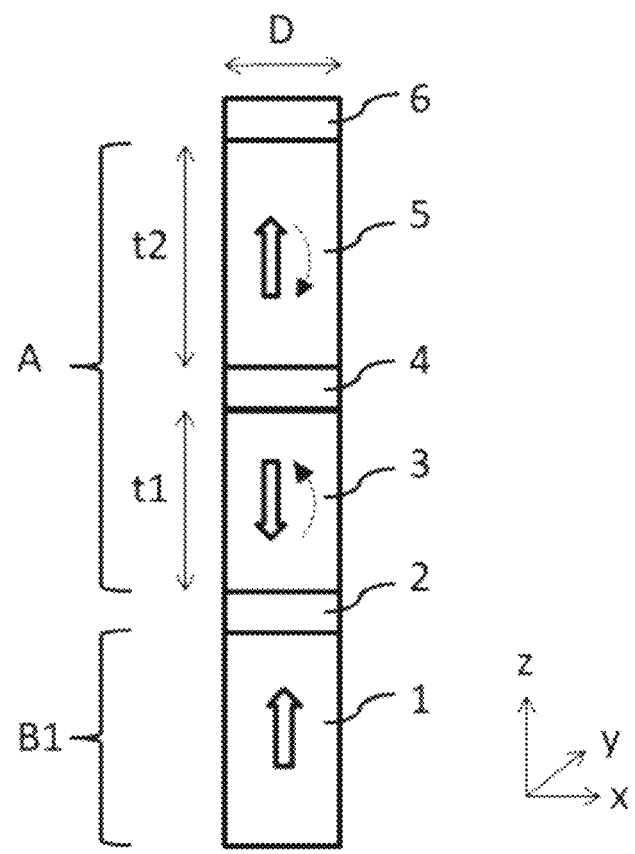
FIG. 1 is a longitudinal section view of an example of the configuration of the magnetoresistance effect element of the present invention.

Hereinafter, the magnetoresistance effect element of the present invention will be described in detail with reference to the drawings.

The drawings are merely exemplary, end will be described with reference numerals, but the present invention is not limited thereto.

Embodiment 1

FIG. 1 shows the basic configuration of Embodiment 1 of the present invention. In the basic configuration of the magnetoresistance effect element, the first reference layer (B1)/first non-magnetic layer (2)/first magnetic layer (3)/non-magnetic coupling layer (4)/second magnetic layer (5)/second non-magnetic layer (6) are arranged adjacent to each other in this order, and the first magnetic layer (3)/non-magnetic coupling layer (4)/second magnetic layer (5) constitute the recording layer (A).

The first reference layer (B1) is of a material including at least one 3d ferromagnetic transition metal element such as Co, Fe, Ni, Mn, and the like, and examples thereof include Co, Fe, CoFe, FeNi, CoNi, CoB, FeB, CoFeB, FePt, TbFeCo, MnAl, MnGa, and the like. Non-magnetic elements such as B, V, Ti, Cr, Zr, Nb, Mo, Hf, Ta, W, Si, Al, Pd, Pt and the like may be further included.

The first reference layer (B1) may be a single layer, a laminated layer or a multilayer, or a laminated layer or a thin layer ferri structure including Pt, Pd, Cu, Ru, W, Ni, and the like. Further, a fixing layer or the like may be provided adjacent to the opposite side of the first reference layer (B1) to the first non-magnetic layer (2).

The film thickness of the first reference layer (B1) is approximately 0.5 nm to 10 nm, depending on the material and layer configuration.

The magnetization direction of the first reference layer (B1) is fixed to the direction perpendicular to the film surface, and faces the recording layer (A) side in FIG. 1, but the magnetization direction may be also reversed.

The first non-magnetic layer (2) is a tunnel junction layer composed of an insulating layer, and preferably includes at least O (oxygen). Examples include oxygen-containing insulators such as MgO, MgAlO, $Al_2O_3$, $SiO_2$, TiO, and $Hf_2O$, and more preferably MgO is used so that the magnetic resistance change rate be greatly expressed by the combination of the materials of the two end faces to be joined.

The film thickness of the first non-magnetic layer (2) is preferably adjusted to the range of 0.1 nm to 10 nm, more preferably 0.2 nm to 5 nm, and even more preferably 0.5 nm to 2 nm.

The first magnetic layer (3) and the second magnetic layer (5) are preferably of a material including at least one 3d ferromagnetic transition metal element such as Co. Fe, Ni, Mn, and the like, and examples thereof include Co, Fe, Ni, CoFe, FeNi, CoNi, CoB, FeB, NiB, CoFeB, MnAl and the like. Non-magnetic elements such as B, V, Ti, Cr, Zr, Nb, Mo, Hf, Ta, W, Si, Al, Pd, Pt, Ir and the like may be further included.

The first magnetic layer (3) and the second magnetic layer (5) may be a single layer or a laminated layer. Examples include a laminated layer film of a layer including Fe and a layer including FeB or CoB.

The first magnetic layer (3) and the second magnetic layer (5) may have the same material, the same composition, or the same saturation magnetization $M_s$, or different materials, different compositions, or different saturation magnetizations $M_s$.

The film thickness $t_1$ (nm) of the first magnetic layer (3) and the film thickness $t_2$ (nm) of the second magnetic layer (5) are formed such as to have the relationships of D<t and D≤$t_2$ or D≤$t_1$ and D<$t_2$ with the junction size D (nm) of the magnetoresistance effect element. The details of the relationships will be described later In the present invention, the junction size is the length of the longest straight line on the end face perpendicular to the thickness direction of the magnetic layer, that is, on the junction surface in contact with the adjacent non-magnetic layer or electrodes. When the surface is circular, the junction size is the diameter, when the surface is elliptical, the junction size is the major axis thereof, and when the surface is quadrangular, the junction size is the longer diagonal line thereof.

Where the relationship between the film thickness $t_1$, the film thickness $t_2$ and the junction size D is satisfied, for example, perpendicular magnetic anisotropy with respect to the film surface can be achieved and the required thermal stability can be obtained even when the junction size is 40 nm or less, 15 nm or less, or 10 nm or less. The reason for this effect will also be described later.

Where the junction size is large, it is also necessary to increase the film thickness due to the above relationship, which makes element processing difficult. From the processing point of view, the junction size is preferably 40 nm or less.

The first magnetic layer (3) and the second magnetic layer (5) are magnetically coupled in the anti-parallel direction.

The non-magnetic coupling layer (4) may be any one that magnetically couples the first magnetic layer (3) and the second magnetic layer (5) in the anti-parallel direction. It is preferable that the non-magnetic coupling layer include any one or more of Ru, Cu, Ir, Pd, Ta, W, Hf, Zr, Nb, Mo, V, Cr or alloys thereof, and Ru, Cu, Ir, Pd, Ta and W are more preferable, and Ru is even more preferable.

The film thickness of the non-magnetic coupling layer (4) may be a range in which the first magnetic layer (3) and the second magnetic layer (5) are magnetically coupled in the anti-parallel direction. The film thickness differs depending on the element configuration material and deposition conditions, but can be exemplified by 0.1 nm to 2 nm, and preferably 0.3 nm to 1 nm. In the case of Ru, the antiferromagnetic coupling magnetic Held has a peak value near 0.4 nm or 0.9 nm, so it is desirable to adjust the film thickness close to this value.

Where the second non-magnetic layer (6) functions as a cap layer, the second non-magnetic layer is composed of an oxide film such as MgO and the like or a metal non-magnetic film such as Ta, W, Hf, Mg, and the like.

Where the second non-magnetic layer (6) functions as a tunnel junction layer, it is desirable that at least O (oxygen) be included. Suitable examples include oxygen-containing insulators such as MgO, MgAlO, $Al_2O_3$, $SiO_2$, TiO, $Hf_2O$ and the like, so that the magnetic resistance change rate be greatly expressed by the combination of the materials of the two end faces to be joined, and it is more preferable to use MgO.

The present invention and the effects thereof will be described in detail hereinbelow.

First, the magnetoresistance effect element of the present invention includes the non-magnetic coupling layer (4) that magnetically couples the first magnetic layer (3) and the second magnetic layer (5) in the anti-parallel direction.

With this configuration, for example, in FIG. 1, the current injected from the recording layer (A) side toward the first reference layer (B1) inverts the magnetization of the second magnetic layer (5) and then a reflection spin is generated in the non-magnetic layer (2), and the magnetization of the first magnetic layer (3) is inverted by the generated reflection spin. Therefore, the current required for the magnetization reversal of the magnetic layer of the recording layer (A) can be reduced to about half.

Figure 21:
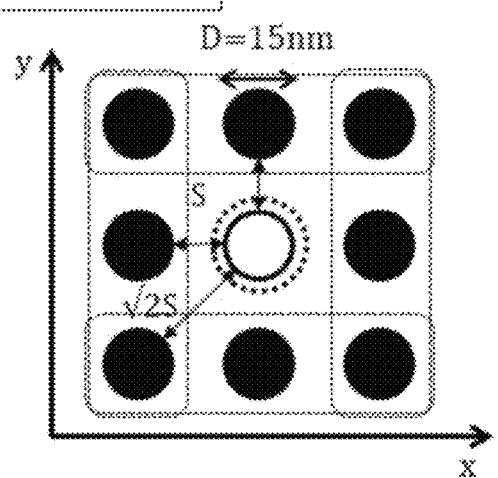
FIG. 21 is an image diagram illustrating a stray magnetic field with an adjacent magnetoresistance effect element.

In the element using shape magnetic anisotropy, the Olin thickness is larger than the diameter of the element. Therefore, a large film thickness is required in the region where the element size is large. Since the size of the stray magnetic field is proportional to the product of the film thickness and the saturation magnetization, there is a problem that the stray magnetic field becomes large when the film thickness is large. In the present invention, the first magnetic layer (3) and the second magnetic layer (5) are magnetically coupled in the anti-parallel direction, thereby making it possible to reduce the stray magnetic field to the outside of the magnetoresistance effect element. Further, as shown in FIG. 21, for example, when the junction size is small with a diameter of 15 nm, the element spacing (corresponding to S in FIG. 21) is also small and is 15 nm, the magnetoresistance effect elements are arranged and selected as 3×3, and the magnetization direction of the selected central element is parallel and the magnetization directions of the other elements are anti-parallel, where the spacing between the adjacent magnetoresistance effect elements decreases, the write current increases due to the influence of the stray magnetic field. This stray magnetic field has an adverse effect such that the magnetization direction of the magnetoresistance effect element in which the magnetization direction originally should be perpendicular to the film surface is tilted, or the write current is increased. However, in the magnetoresistance effect element of the present invention in which the stray magnetic field can be reduced and which has high thermal stability due to the effect of shape anisotropy even with a small element and is unlikely to be affected by the stray magnetic field, the effect of stray magnetic field on the adjacent elements is small because of a small stray magnetic field and high thermal stability.

Next, the film thickness $t_1$ (nm) and the film thickness $t_2$ (nm) of the magnetoresistance effect element of the present invention are formed to have the relationships of D<$t_1$ and D≤$t_2$ or the relationships of D≤$t_1$ and D<$t_2$ with the junction size D (nm) of the magnetoresistance effect element. These relational expressions hold based on the following facts.

In the thermal stability factor $\Delta(=E/k_BT)$ of the magnetic layer functioning as the recording layer, which determines the retention performance of bit information of the magnetoresistance effect element, the energy barrier E is represented by the product of the magnetic anisotropy energy density K and the volume V of the recording layer. Here, in the coordinates where the x-axis and the y-axis are in the plane and the z-axis is in the direction perpendicular to the plane, the magnetic anisotropy energy density K is expressed by the following equation of Formula 1.

$$K=K_i/t+K_b-(N_z-N_x)M_s^2/2\mu_0 \quad \text{[Math. 1]}$$

Here, $K_i$ is the interface magnetic anisotropy energy density, t is the film thickness of the recording layer, $K_b$ is the bulk magnetic anisotropy energy density derived from the crystal magnetic anisotropy and the magnetic elastic effect, Nz and Nx are the z-axis and x-axis demagnetization coefficients, respectively, Ms is the saturation magnetization of the recording layer, and $\mu_0$ is the vacuum permeability. When the magnetic anisotropy energy density K is positive, perpendicular magnetic anisotropy is demonstrated, and when the magnetic anisotropy energy density is negative, in-plane magnetic anisotropy is demonstrated.

Explained hereinbelow are the conditions for the recording layer (A) to have a perpendicular magnetic anisotropy in the case of the configuration of the magnetoresistance effect element of the present invention, that is, when the magnetic layer of the recording layer (A) is divided into the first magnetic layer (3) and the second magnetic layer (5), and these layers are magnetically coupled in the anti-parallel direction to obtain opposite magnetization directions.

Where the recording layer (A) includes the first magnetic layer (3) having the film thickness $t_1$ and the second magnetic layer (5) having the film thickness $t_2$, the magnetic anisotropy energy density K of the recording layer (A) is represented by the following Formula 2.

$$K = K_{u1} + K_{u2}$$ [Math. 2]

$$= (K_{i1}/t_1 + K_{i2}/t_2) + (K_{b1} + K_{b2}) -$$

$$(N_1 M_{s1}^2 / 2\mu_0 t_1 + N_2 M_{s2}^2 / 2\mu_0 t_2)$$

$$\because K_{u1} = K_{i1}/t_1 + K_{b1} - N_1 M_{s1}^2 / 2\mu_0 t_1$$

$$K_{u2} = K_{i2}/t_2 + K_{b2} - N_2 M_{s2}^2 / 2\mu_0 t_2$$

$$N_1 = N_{z1} - N_{x1}$$

$$N_2 = N_{z2} - N_{x2}$$

Here, $K_{u1}$ is the magnetic anisotropy energy density of the first magnetic layer (3), $K_{u2}$ is the magnetic anisotropy energy density of the second magnetic layer (5), $K_{i1}$ is the interface magnetic anisotropy energy density of the first magnetic layer (3) and the first non-magnetic layer (2), $K_{i2}$ is the interface magnetic anisotropy energy density of the second magnetic layer (5) and the second non-magnetic layer (6). $K_{b1}$ is the bulk magnetic anisotropy energy density of the first magnetic layer (3), $K_{b2}$ is the bulk magnetic anisotropy energy density of the second magnetic layer (5), $N_1$ is the demagnetization coefficient of the first magnetic layer (3), and $N_2$ is the demagnetization coefficient of the second magnetic layer (5), $M_{s1}$ is the saturation magnetization of the first magnetic layer (3), and $M_{s2}$ is the saturation magnetization of the second magnetic layer (5).

Here, where, for convenience, $K_{i1}=K_{i2}=K_{b1}=K_{b2}=0$ in order to simplify the calculation, Formula 3 is obtained.

$$K = -(N_1 M_{s1}^2 / 2\mu_0 t_1 + N_2 M_{s2}^2 / 2\mu_0 t_2)$$ [Math. 3]

However, $K_{i1}$, $K_{i2}$, $K_{b1}$ and $K_{b2}$ actually do not have to be 0, and when Formula 2 is positive, a perpendicular magnetic anisotropy is obtained.

$$-(N_1 M_{s1}^2 / 2\mu_0 t_1 + N_2 M_{s2}^2 / 2\mu_0 t_2) > 0$$ [Math. 4]

In Formula 4, $M_{s1}$, $M_{s2}$, $\mu_0$, $t_1$, and $t_2$ are always positive, so where the demagnetization coefficients $N_1$ and $N_2$ are negative, the relationship of Formula 4 holds. Therefore, the sign of the demagnetization coefficients $N_1$ and $N_2$ will be described in more detail.

Figure 22:
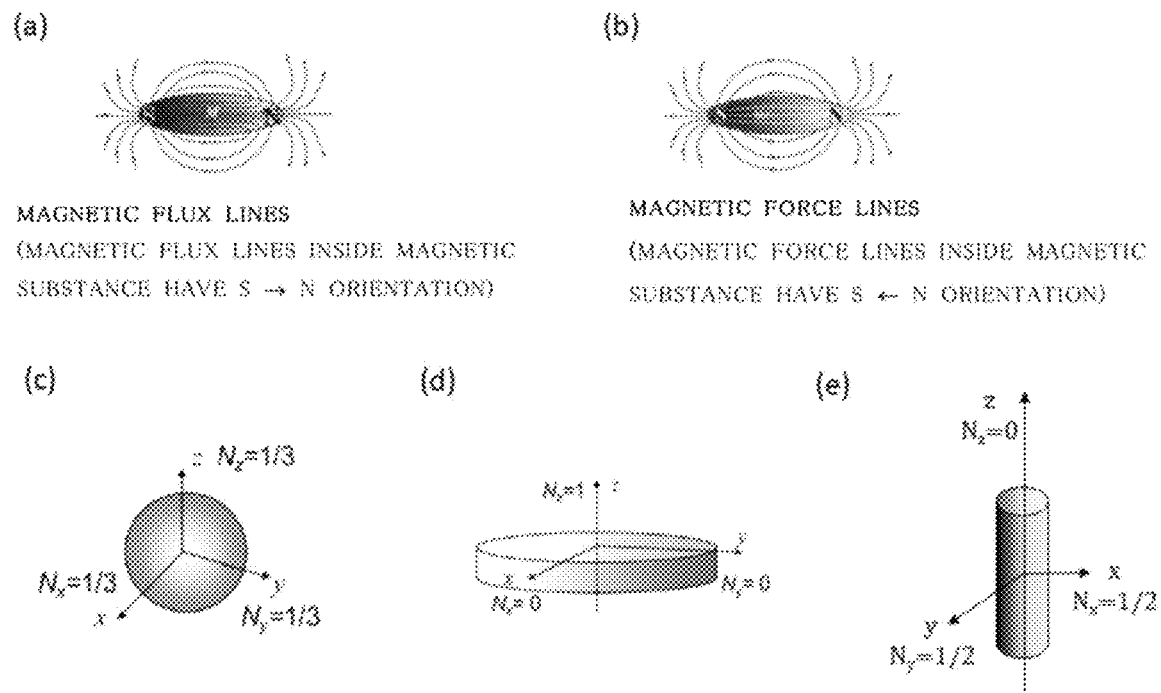
FIG. 22 is a diagram illustrating a diamagnetic field and the shape dependence of the diamagnetic field.

Here, the diamagnetic field is the magnetic field $H_d$ inside the magnetic substance, and since the direction of magnetization (direction of magnetic flux lines) and the direction of magnetic field (direction of magnetic field line) are opposite inside the magnetic substance, it is called diamagnetic field. FIG. 22(a) shows magnetic flux lines connecting the outside and the inside of the magnetic substance, and FIG. 22(b) shows magnetic force lines formed by the magnetic field formed by the magnetic poles.

Since such diamagnetic field $H_d$ is generated by magnetization M, the relationship of $\mu_0 H_d = -NM$ is established in proportion to magnetization M. The proportional coefficient N is called a demagnetization coefficient.

The demagnetization coefficient N is a vector quantity, has components in x, y, and z axial directions which are expressed as $N_x$, $N_y$, and $N_z$, respectively, and has the relation represented by Formula 5.

$$N_x + N_y + N_z = 1$$ [Math. 5]

The values of $N_x$, $N_y$, and $N_z$ are determined by the shape of the magnetic substance. The orientation of the shape magnetic anisotropy was also examined, including the relationship between the z axial direction (film thickness t) and the xy axial directions (in-plane directions of the element).

Where the magnetic substance has a spherical shape (corresponding to the case of D=t), as shown in FIG. 22(c), since the shape is isotropic, $N_x=N_y=N_z$, and according to Formula 5, $N_x=N_y=N_z=\frac{1}{3}$. Therefore, $N=N_z-N_x=0$ and the magnetic substance does not have a shape magnetic anisotropy.

Where the magnetic substance has a flat shape in the xy axial directions (where D>t), as shown in FIG. 22(d), the magnetic poles in the xy axial directions are set apart, so that the corresponding demagnetization coefficient is $N_x=N_y=0$, and according to Formula 5, $N_x=1$. Therefore, $N=N_z-N_x=1>0$, and the magnetic substance has a shape magnetic anisotropy in the in-plano direction.

Where the magnetic substance has a long shape in the z axial direction (where D<t), as shown in FIG. 22(e), the magnetic poles in the z axial direction are set apart, so that the corresponding demagnetization coefficient $N_z=0$, and since the x-axis are y-axis are symmetric, $N_x=N_y$, and according to Formula 5, $N_x=N_y=\frac{1}{2}$. Therefore, $N=N_z-N_x=-\frac{1}{2}<0$, and the magnetic substance has a shape magnetic anisotropy in the perpendicular direction.

Next, the cases where the recording layer is divided into the first magnetic layer (3) having the film thickness $t_1$ and the second magnetic layer (5) having the film thickness $t_2$ were classified as follows.

<Category 1>

Where $D<t_1$ and $D<t_2$, $N_1<0$ and $N_2<0$. Therefore, K in Formula 3 always takes a positive value, and the magnetic substance always has a shape magnetic anisotropy in the perpendicular direction.

<Category 2>

Where $D=t_1$ and $D=t_2$, N, =0 and N==0. Therefore, K=0 in Formula 3, and the magnetic substance does not have shape magnetic anisotropy.

<Category 3>

Where $D>t_1$ and $D>t_2$, $N_1>0$ and $N_3>0$. Therefore, K in Formula 3 always takes a negative value, and the magnetic substance always has a shape magnetic anisotropy in the in-plane direction.

<Category 4>

Where $D<t_1$ and $D=t_2$, or where $D=t_1$ and $D<t_2$, $N_1<0$ and $N_2=0$, or $N_1=0$ and $N_2<0$. Therefore, K in Formula 3 always takes a positive value, and the magnetic substance always has a shape magnetic anisotropy in the perpendicular direction.

<Category 5>

Where $t_2<D<t_1$ or $t_1<D<t_2$, the magnetic substance has a shape magnetic anisotropy in the perpendicular direction only when K in Formula 3 is positive.

Here, where the saturation magnetization $M_{s1}$ of the first magnetic layer (3) is the same as the saturation magnetization Ma of the second magnetic layer (5) (where $M_{s1}=M_{s2}$), as in the case where the first magnetic layer (3) and the second magnetic layer (5) are formed of the same material and have the same composition, the representation as in Formula 6 hereinbelow is obtained by dividing both sides of Formula 4 by $-M_{s1}/2\mu_0 t_1 t_2$, and where this relationship is satisfied, a shape magnetic anisotropy in the perpendicular direction is obtained.

$$t_2 N_1 + t_1 N_2 < 0 \quad \text{[Math. 6]}$$

Spheroid approximation and flat ellipsoid approximation were used to determine in what case the relationship of Formula 6 holds within the range of $t_2 < D < t_1$ or $t_1 < D < t_2$.

Where t>D, from the spheroid approximation, N is represented by the relationship of Formula 7 hereinbelow, and where Formula 7 is linearly approximated, the relationship of Formula 8 is obtained.

$$N_{zi} = \frac{1}{k_i^2 - 1}\left\{\frac{k_i}{\sqrt{k_i^2 - 1}}\ln\left(k_i + \sqrt{k_i^2 - 1}\right) - 1\right\} \quad \text{[Math. 7]}$$

where $t_i > D$, $k_i = t_i/D > 1$
where $$N = 2.08 \times 10^{-6} k_i^6 - 1.07 \times 10^{-4} k_i^5 + 2.25 \times 10^{-3} k_i^4 - 2.47 \times 10^{-2} k_i^3 + 0.152 k_i^2 - 0.516 k_i + 0.353 \quad \text{[Math. 8]}$$

Meanwhile, where t<D, from the flat ellipsoidal approximation, N is represented by the relationship of Formula 9 hereinbelow, and where Formula 9 is linearly approximated, the relationship of Formula 10 is obtained.

$$N_{xi} = \frac{1}{2}\left\{\frac{k_i - 2}{(k_i^{-2} - 1)^{3/2}}\sin^{-1}\frac{\sqrt{k_i^{-2} - 1}}{k_i^{-1}} - \frac{1}{k_i^{-2} - 1}\right\} \quad \text{[Math. 9]}$$

where $t_i < D$, $k_i = t_i/D < 1$
where $$N = 0.4612 k_i^2 - 1.422 k_i + 0.967 \quad \text{[Math. 10]}$$

Figure 23:
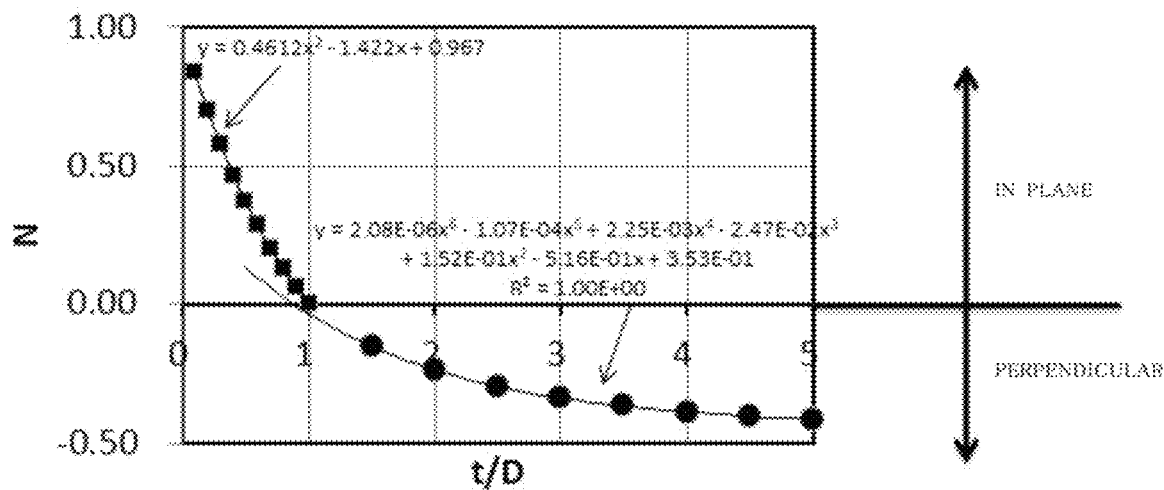
FIG. 23 is a graph showing the relationship between the demagnetization coefficient N, film thickness and junction size.

FIG. 23 shows the relationship between the demagnetization coefficient N and t/D which is plotted based on Formulas 8 and 10. Where t/D<1, that is, t<D, the magnetic substance has a shape magnetic anisotropy in the in-plane direction, and where t/D>1, that is, t>D, the magnetic substance has a shape magnetic anisotropy in a perpendicular direction. The specific values thereof can be derived from the approximation curve.

When $t_2 < D < t_1$ or $t_1 < D < t_2$, where Formulas 8 and 10 are assigned in Formula 6 and the relationship of Formula 6 is satisfied, the shape magnetic anisotropy in the perpendicular direction is obtained.

Simplifying, where the demagnetization coefficients $N_1$ and $N_2$ are each read from FIG. 23 and assigned, together with each film thickness, in Formula 6, in the negative range, a perpendicular magnetic anisotropy is obtained.

In addition, when the saturation magnetization $M_{s1}$ of the first magnetic layer (3) and the saturation magnetization $M_{s2}$ of the second magnetic layer (5) are different from each other (where $M_{s2} = aM_{s1}$; a is a constant), as in the case where the first magnetic layer (3) and the second magnetic layer (5) are formed of different materials and have different compositions, where $aM_{s1}$ is assigned instead of M in Formula 4 and both sides are divided by $-M_{s1}/2\mu_0 t_1 t_2$, the representation as in Formula 11 hereinbelow is obtained, and where this relationship is satisfied, a shape magnetic anisotropy in the perpendicular direction is obtained.

$$t_2 N_1 + a^2 t_1 N_2 < 0 \quad \text{[Math. 11]}$$

Even when the saturation magnetization $M_{s1}$ of the first magnetic layer (3) and the saturation magnetization $M_{s2}$ of the second magnetic layer (5) are different from each other, as in the case where the layers are formed of different materials and have different compositions, where Formulas 8 and 10 are assigned in Formula 11 and the relationship of Formula 11 is satisfied, a shape magnetic anisotropy in the perpendicular direction is obtained.

As described above, from the analysis of <Category 1> to <Category 5>, it can be said that in the range of $D < t_1$ and $D \le t_2$, or $D \le t_1$ and $D < t_2$, in which at least the relationships of <Category 1> and <Category 4> are satisfied, the shape magnetic anisotropy in the perpendicular direction is always obtained, and from the analysis of <Category 5>, it is understood that even if either the film thickness $t_1$ or the film thickness $t_2$ is smaller than the junction size D, a shape magnetic anisotropy in the perpendicular direction is obtained in the range of Formula 6 or Formula 11.

Figure 24:
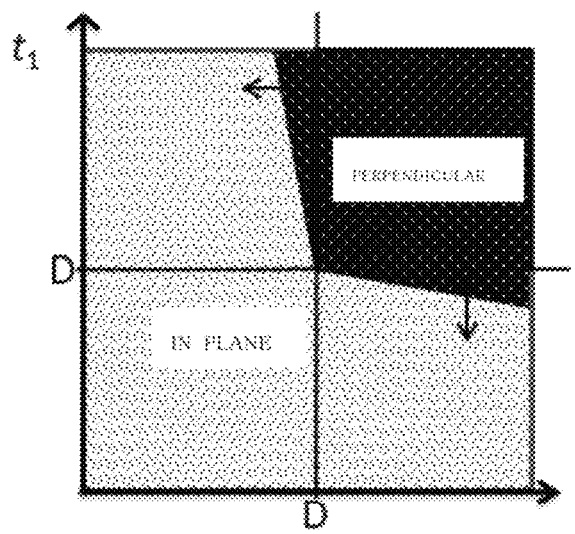
FIG. 24 is a conceptual diagram showing a range showing perpendicular magnetic anisotropy in the relationship between the film thickness and the junction size of two magnetic layers that are magnetically coupled in the antiparallel direction of the present invention.

FIG. 24 shows a conceptual diagram of a region in which the shape magnetic anisotropy in the perpendicular direction is obtained in the relationship of the film thickness $t_1$, the film thickness $t_2$ and the junction size D.

It is conceivable that the region of film thickness in which the shape magnetic anisotropy is in the perpendicular direction increases when the interface magnetic anisotropy energy density, which has been assumed to be 0 in the calculation, is positive ($K_{i1}$, $K_{i2} > 0$).

Embodiment 2

Figure 2:
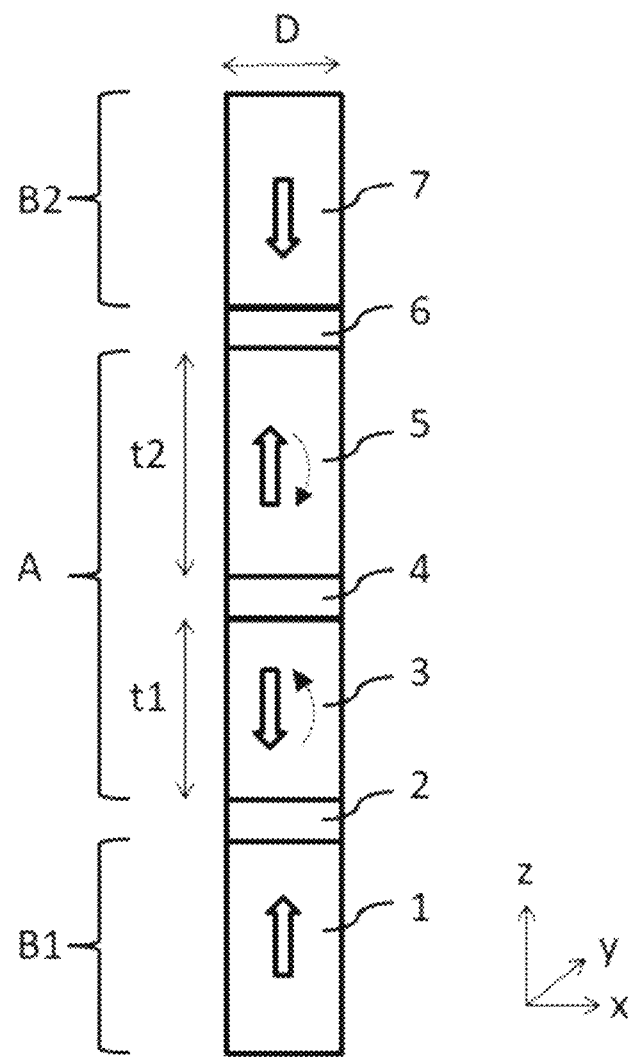
FIG. 2 is a longitudinal section view of another example of the configuration of the magnetoresistance effect element of the present invention.

FIG. 2 shows the configuration of Embodiment 2 of the present invention. In the configuration of the magnetoresistance effect element, the first reference layer (B1)/first non-magnetic layer (2)/first magnetic layer (3)/non-magnetic coupling layer (4)/second magnetic layer (5)/second non-magnetic layer (6)/second reference layer (B2) am arranged adjacent to each other in this order, and the first magnetic layer (3)/non-magnetic coupling layer (4)/second magnetic layer (5) constitute the recording layer (A).

Embodiment 2 has the same features as those of Embodiment 1 except for the following points.

The second reference layer (B2) is of a material including at least one 3d ferromagnetic transition metal element such as Co, Fe, Ni, Mn, and the like, and examples thereof include Co, Fe, CoFe, FeNi, CoNi, CoB, FeB, CoFeB, FePt, TbFeCo, MnAl, MnGa, and the like. Non-magnetic elements such as B, V, Ti, Cr, % r, Nb, Mo, Hf, Ta, W, Si, Al, Pd, Pt and the like may be further included.

The second reference layer (B2) may be a single layer, a laminated layer or a multilayer, or a laminated layer or a thin layer ferri structure including Pt, Pd, Cu, Ru, W, Ni, and the like.

The film thickness of the second reference layer (B2) is approximately 0.5 nm to 10 nm, depending on the material and layer configuration.

The magnetization direction of the second reference layer (2) is fixed to the direction perpendicular to the film surface, and faces the recording layer (A) side in FIG. 2, but the magnetization direction may be also reversed. Further, the magnetization direction of the first reference layer (B1) and the magnetization direction of the second reference layer (B2) are opposite each other (anti-parallel).

The second non-magnetic layer (6) is a tunnel junction layer composed of an insulating layer, and preferably includes at least O (oxygen). Examples include oxygen-containing insulators such as MgO, MgAlO, $AlO_3$, $SiO_2$, TiO, and $H_2O$, and more preferably MgO is used so that the magnetic resistance change rate be greatly expressed by the combination of the materials of the two end faces to be joined.

The film thickness of the second non-magnetic layer (6) is preferably adjusted to the range of 0.1 nm to 10 nm, more preferably 0.2 nm to 5 nm, and even more preferably 0.5 nm to 2 nm.

Further, the film thickness of the first non-magnetic layer (2) may be different from the film thickness of the second non-magnetic layer (6), and the material or composition of the first non-magnetic layer (2) may be different from that of the second non-magnetic layer (6).

Although not shown, usually, a lower non-magnetic electrode is arranged on the first reference layer (B1) on the side opposite to that of the recording layer (A), an upper non-magnetic electrode is arranged on the second reference layer (B2) on the side opposite to that of the recording layer (A), and the magnetoresistance effect element is electrically connected to the selection transistor via the electrodes.

Embodiment 3

Figure 3:
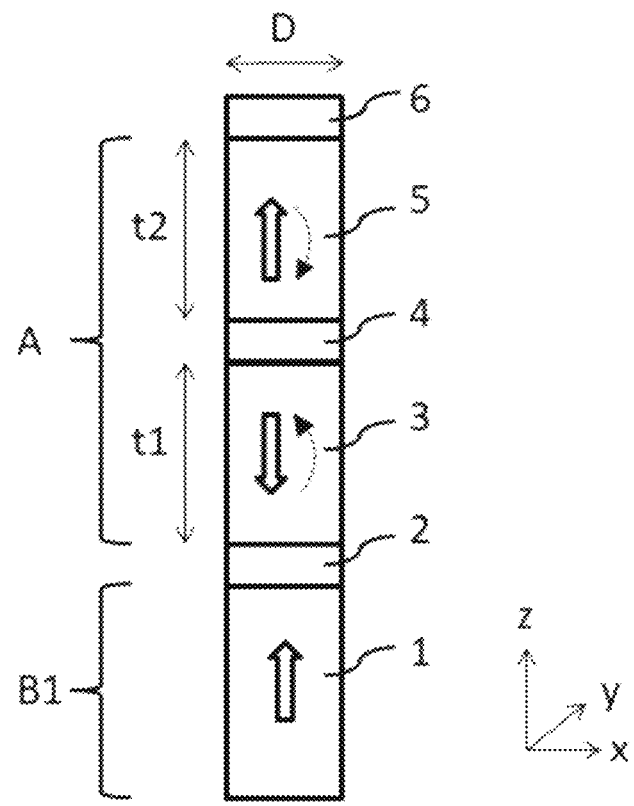
FIG. 3 is a longitudinal section view of another example of the configuration of the magnetoresistance effect element of the present invention.

FIG. 3 shows the basic configuration of Embodiment 3 of the present invention. The basic configuration of the magnetoresistance effect element is the same as that of Embodiment 1 except that the film thickness $t_1$ and the film thickness $t_2$ are equal to each other, and has the same features as those of Embodiment 1 except for the following points.

That is, the film thickness $t_1$ (nm) of the first magnetic layer (3) and the film thickness $t_2$ (nm) of the second magnetic layer (5) have the relationships of $D<t_1$ and $D<t_2$ with the junction size D (nm) of the magnetoresistance effect element and $t_1=t_2$. As described in detail in Embodiment 1, where $D<t_1$ and $D<t_2$, $N_1<0$ and $N_2<0$, so that even when the film thicknesses of the two magnetic layers are the same ($t_1=t_2$), the magnetic anisotropy energy density K always takes a positive value and a shape magnetic anisotropy in the perpendicular direction is obtained.

Embodiment 4

Figure 4:
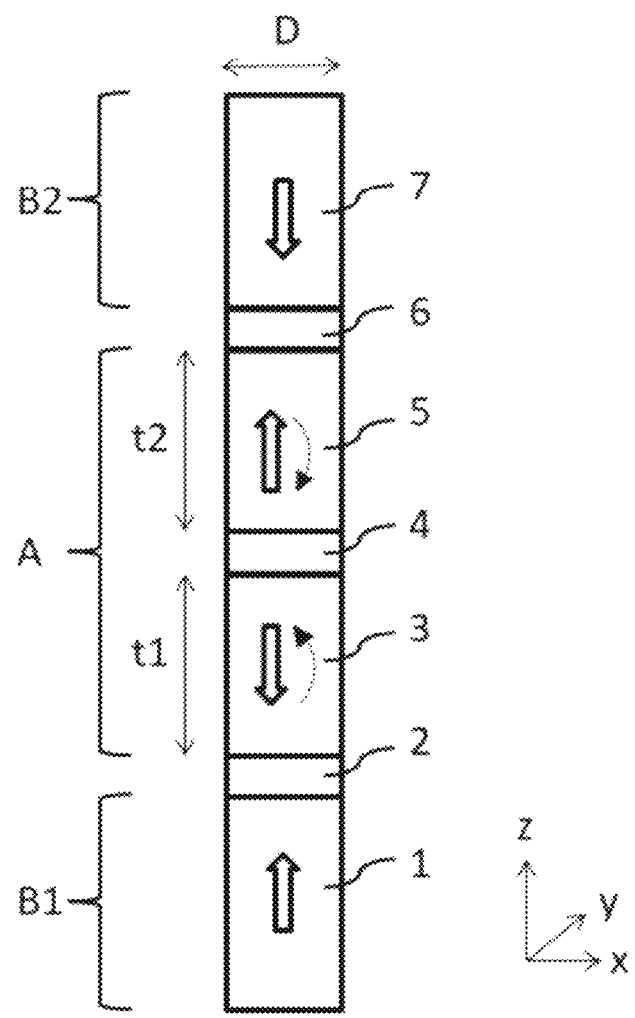
FIG. 4 is a longitudinal section view of another example of the configuration of the magnetoresistance effect element of the present invention.

FIG. 4 shows the basic configuration of Embodiment 4 of the present invention. The basic configuration of the magnetoresistance effect element is the same as that of Embodiment 2 except that the film thickness $t_1$ and the film thickness $t_2$ are equal to each other, and has the same features as those of Embodiment 2 except for the following points.

That is, the film thickness $t_1$ (nm) of the first magnetic layer (3) and the film thickness $t_2$ (nm) of the second magnetic layer (5) have the relationships of $D<t_1$ and $D<t_2$ with the junction size D (nm) of the magnetoresistance effect element and $t_1=t_2$. As described in detail in Embodiment 1, where $D<t_1$ and $D<t_2$, $N_1<0$ and $N_2<0$, so that even when the film thicknesses of the two magnetic layers are the same ($t_1=t_2$), the magnetic anisotropy energy density K always takes a positive value and a shape magnetic anisotropy in the perpendicular direction is obtained.

Embodiment 5

Figure 5:
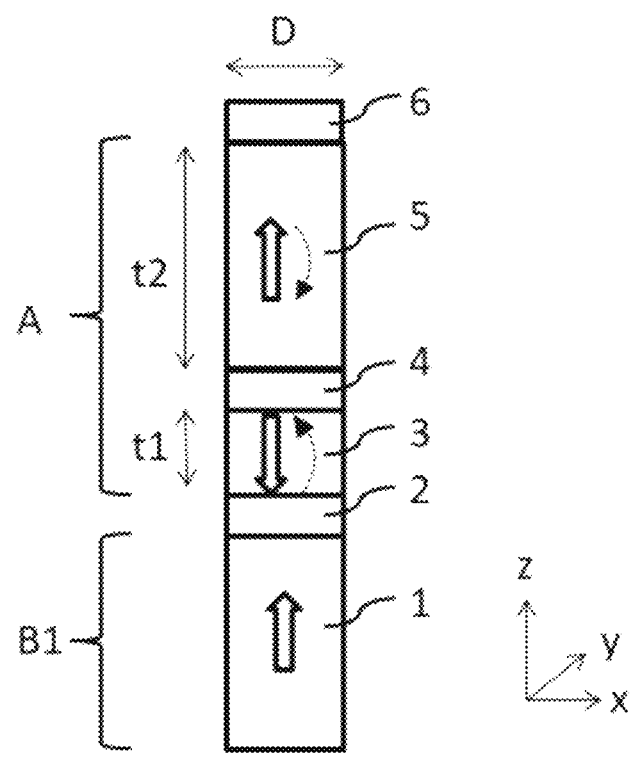
FIG. 5 is a longitudinal section view of another example of the configuration of the magnetoresistance effect element of the present invention.

FIG. 5 shows the basic configuration of Embodiment 5 or the present invention. The basic configuration of the magnetoresistance effect element is the same as that of Embodiment 1 except that the film thickness $t_1$ is smaller than the junction size D, and has the same features as those or Embodiment 1 except for the following points.

That is, the film thickness $t_1$ (nm) of the first magnetic layer (3) and the film thickness $t_2$ (nm) of the second magnetic layer (5) have the relationships of $D>t_1$ and $D<t_2$ with the junction size D (nm) of the magnetoresistance effect element. As described in detail in Embodiment 1, where $D>t_1$ and $D<t_2$, $N_1>0$ and $N_2<0$, and within the range that satisfies Formula 6 or 11, even when the film thickness of one magnetic layer is less than the junction size, the magnetic anisotropy energy density K takes a positive value and a shape magnetic anisotropy in the perpendicular direction is obtained.

Figure 25:
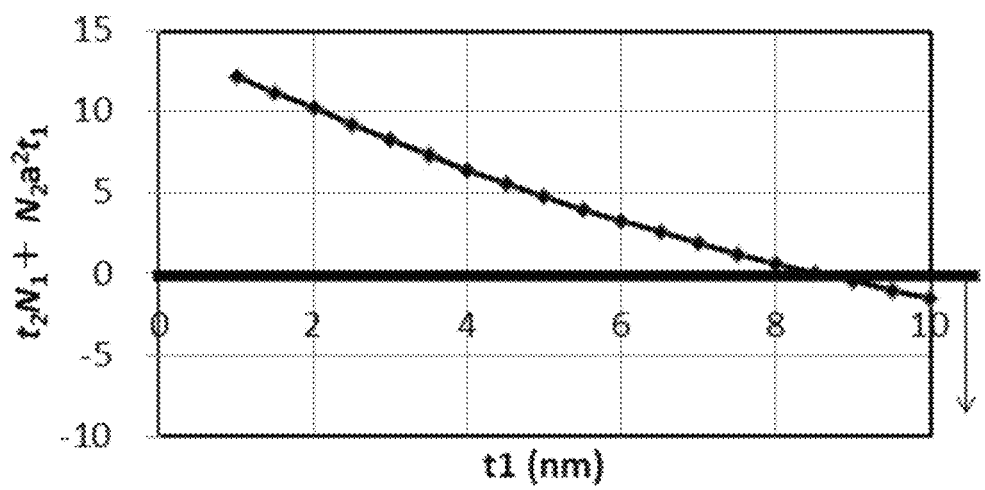
FIG. 25 is a graph showing the range of film thickness and perpendicular magnetic anisotropy of Embodiments 5 and 6.

FIG. 25 shows a graph showing the relationship between the film thickness $t_1$ at which a perpendicular magnetic anisotropy is obtained and the left side of Formula 11 in the case where the junction size D is 10 nm, the film thickness $t_2$ is 15 nm, and the first magnetic layer (3) and the second magnetic layer (5) are of the same material or the same composition (the saturation magnetization $M_{s2}$ of the second magnetic layer (5) is the same as the saturation magnetization $M_{s1}$ of the first magnetic layer (3), that is, a=1). In this case, the film thickness $t_1$ at which the perpendicular magnetic anisotropy is to be obtained needs to be about 9 nm or more.

Figure 26:
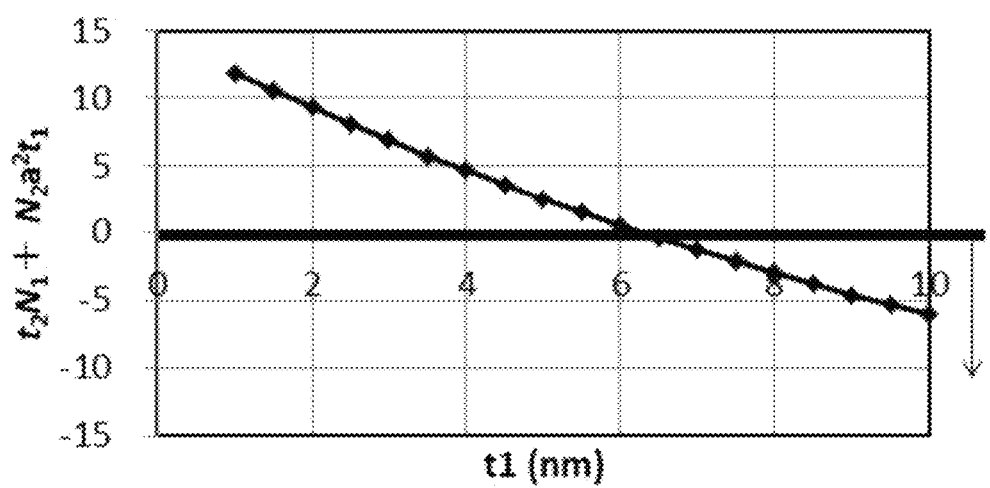
FIG. 26 is a graph showing the range of film thickness and perpendicular magnetic anisotropy of Embodiments 5 and 6.

FIG. 26 shows a graph obtained by finding the film thickness $t_1$ at which a perpendicular magnetic anisotropy is obtained from the relationship with the left side of Formula 11 in the case where the junction size D is 10 nm, the film thickness $t_2$ is 15 nm, and the first magnetic layer (3) and the second magnetic layer (5) are of different materials or different compositions (the saturation magnetization Ma of the second magnetic layer (5) is twice the saturation magnetization $M_{s1}$ of the first magnetic layer (3)). In this case, the film thickness $t_1$ at which the perpendicular magnetic anisotropy is to be obtained needs to be about 6.5 nm or more.

Embodiment 6

Figure 6:
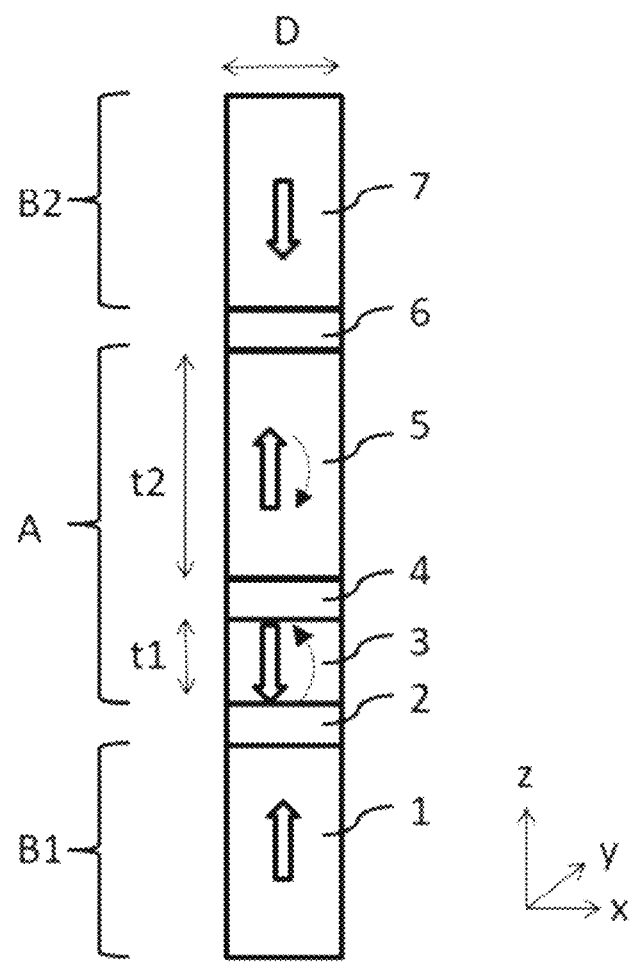
FIG. 6 is a longitudinal section view of another example of the configuration of the magnetoresistance effect element of the present invention.

FIG. 6 shows the basic configuration of Embodiment 6 of the present invention. The basic configuration of the magnetoresistance effect element is the same as that of Embodiment 2 except that the film thickness $t_1$ is smaller than the junction size D, and has the same features as those of Embodiment 2 except for the following points.

That is, the film thickness $t_1$ (nm) of the first magnetic layer (3) and the film thickness $t_2$ (nm) of the second magnetic layer (5) have the relationships of $D>t_1$ and $D<t_2$ with the junction size D (nm) of the magnetoresistance effect element. As described in detail in Embodiment 1, where $D>t_1$ and $D<t_2$, $N_1>0$ and $N_2<0$, and within the range that satisfies Formula 6 or 11, even when the film thickness of one magnetic layer is less than the junction size, the magnetic anisotropy energy density K takes a positive value and a shape magnetic anisotropy in the perpendicular direction is obtained.

FIG. 25 shows a graph showing the relationship between the film thickness t at which a perpendicular magnetic anisotropy is obtained and the left side of Formula 11 in the case where the junction size D is 10 nm, the film thickness $t_2$ is 15 nm, and the first magnetic layer (3) and the second magnetic layer (5) are of the same material or the same composition (a=1). In this case, the film thickness $t_1$ at which the perpendicular magnetic anisotropy is to be obtained needs to be about 9 nm or more.

FIG. 26 shows a graph obtained by finding the film thickness $t_1$ at which a perpendicular magnetic anisotropy is obtained f-om the relationship with the left side of Formula 11 in the case where the junction size D is 10 nm, the film thickness $t_2$ is 15 nm, and the first magnetic layer (3) and the second magnetic layer (5) are of different materials or different compositions (the saturation magnetization $M_{s2}$ of the second magnetic layer (5) is twice the saturation magnetization $M_{s1}$ of the first magnetic layer (3)). In this case, the film thickness $t_1$ at which the perpendicular magnetic anisotropy is to be obtained needs to be about 6.5 nm or more.

Embodiment 7

Figure 7:
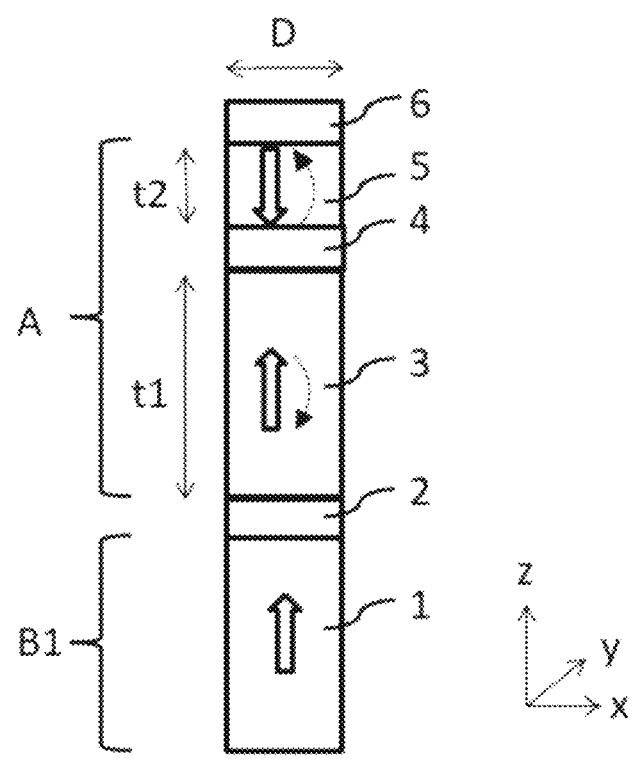
FIG. 7 is a longitudinal section view of another example of the configuration of the magnetoresistance effect element of the present invention.

FIG. 7 shows the basic configuration of Embodiment 7 of the present invention. The basic configuration of the magnetoresistance effect element is the same as that of Embodiment 1 except that the film thickness $t_1$ is smaller than the junction size D, and has the same features as those of Embodiment 1 except for the following points.

That is, the film thickness $t_1$ (nm) of the first magnetic layer (3) and the film thickness $t_2$ (nm) of the second magnetic layer (5) have the relationships of $D<t_1$ and $D>t_2$ with the junction size D (nm) of the magnetoresistance effect element. As described in detail in Embodiment 1, where $D>t_1$ and $D<t_2$, $N_1<0$ and $N_1>0$, and within the range that satisfies Formula 6 or 11, even when the film thickness of one magnetic layer is less than the junction size, the magnetic anisotropy energy density K takes a positive value and a shape magnetic anisotropy in the perpendicular direction is obtained.

Embodiment 8

Figure 8:
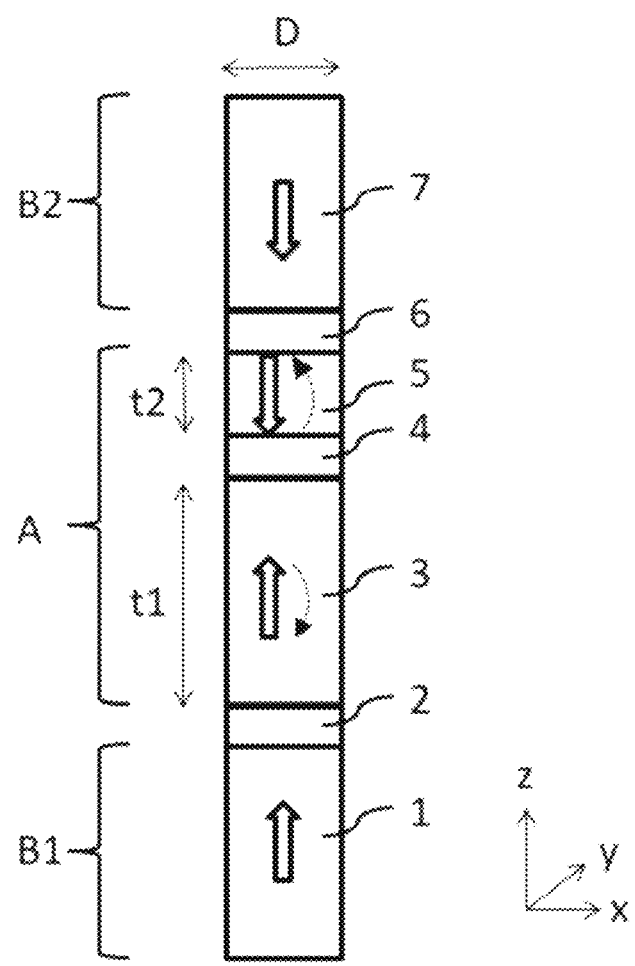
FIG. 8 is a longitudinal section view of another example of the configuration of the magnetoresistance effect element of the present invention.

FIG. 8 shows the basic configuration of Embodiment 8 of the present invention. The basic configuration or the magnetoresistance effect element is the same as that of Embodiment 2 except that the film thickness $t_2$ is smaller than the junction size D, and has the same features as those of Embodiment 2 except for the following points.

That is, the film thickness $t_1$ (nm) of the first magnetic layer (3) and the film thickness $t_2$ (nm) of the second magnetic layer (5) have the relationships of $D<t_1$ and $D>t_2$ with the junction size D (nm) of the magnetoresistance effect element. As described in detail in Embodiment 1, where $D<t_1$ and $D>t_2$, $N_1<0$ and $N_1>0$, and within the range that satisfies Formula 6 or 11, even when the film thickness of one magnetic layer is less than the junction size, the magnetic anisotropy energy density K takes a positive value and a shape magnetic anisotropy in the perpendicular direction is obtained.

Embodiment 9

Figure 9:
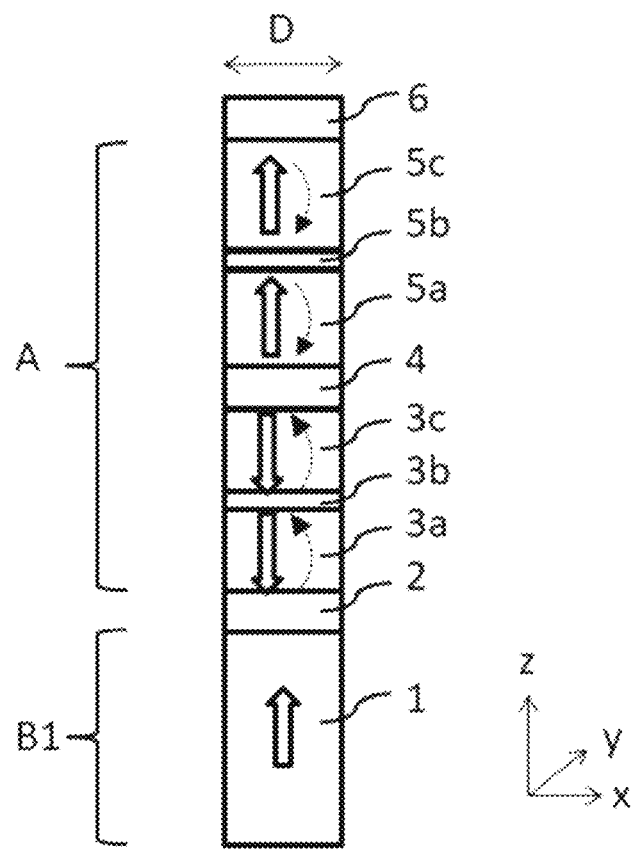
FIG. 9 is a longitudinal section view of another example of the configuration of the magnetoresistance effect element of the present invention.

FIG. 9 shows the basic configuration of Embodiment 9 of the present invention. In the basic configuration of the magnetoresistance effect element, the first reference layer (B1)/first non-magnetic layer (2)/first divided magnetic layer (3a)/first non-magnetic insertion layer (3b)/second divided magnetic layer (3c)/non-magnetic coupling layer (4)/third divided magnetic layer (5a)/second non-magnetic insertion layer (5b)/fourth divided magnetic layer (5c)/second non-magnetic layer (6) are arranged adjacent to each other in this order, and the first divided magnetic layer (3a)/first non-magnetic insertion layer (3b)/second divided magnetic layer (3c)/non-magnetic coupling layer (4)/third divided magnetic layer (5a)/second non-magnetic insertion layer (5b)/fourth divided magnetic layer (5c) constitute the recording layer (A).

Embodiment 9 has the same features as those of Embodiment 1 except for the following points.

The first divided magnetic layer (3a), the second divided magnetic layer (3c), the third divided magnetic layer (5a), and the fourth divided magnetic layer (5c) are of materials including at least one 3d ferromagnetic transition metal element such as Co, Fe, Ni, Mn, and the like, and examples thereof include Co, Fe, Ni, CoFe, FeNi, CoNi, CoB, FeB, NiB, CoFeB, MnAl, and MnGa. Non-magnetic elements such as B, V, Ti, Cr, Zr, Nb, Mo, Hf, Ta, W, Si, Al, Pd, Pt and the like may be further included.

The ratio of the Fe composition of the first divided magnetic layer (3a) to the Fe composition of the second divided magnetic layer (3c) may be greater than 1, or the ratio of the Co composition of the first divided magnetic layer (3a) to the Co composition of the second divided magnetic layer (3c) may be less than 1. This is because a strong interfacial magnetic coupling can be obtained by increasing the amount of Fe in the first divided magnetic layer (3a), and a strong antiferromagnetic coupling can be obtained by increasing the amount of Co in the second divided magnetic layer (3c), thereby ensuring stable operation of the magnetoresistance effect element.

For the same reason, the ratio of the Fe composition of the fourth divided magnetic layer (5c) to the Fe composition of the third divided magnetic layer (5a) may be greater than 1, or the ratio of the Co composition of the fourth divided magnetic layer (5c) to the Co composition of the third divided magnetic layer (5a) may be less than 1.

The first divided magnetic layer (3a) and the second divided magnetic layer (3c) are magnetically coupled in the parallel direction, the third divided magnetic layer (5a) and the fourth divided magnetic layer (5c) are magnetically coupled in the parallel direction, and the magnetization directions of the magnetic layers magnetically coupled in the parallel direction are inverted to have the same orientation.

The second divided magnetic layer (3c) and the third divided magnetic layer (5a) are magnetically coupled in the anti-parallel direction by the non-magnetic coupling layer (4).

The first divided magnetic layer (3a), the second divided magnetic layer (3c), the third divided magnetic layer (5a) and the fourth divided magnetic layer (5c) each may be laminated or constituted as a single layer. A laminated layer film of a Fe-containing layer and a FeB- or CoB-containing layer is an example.

The first divided magnetic layer (3a), the second divided magnetic layer (3c), the third divided magnetic layer (5a) and the fourth divided magnetic layer (5c) may be of the same material and the same composition, or may have the same saturation magnetization Ms. and may be of different materials and different compositions, or may have different saturation magnetizations Ms.

The first non-magnetic insertion layer (3b) and the second non-magnetic insertion layer (5b) include a non-magnetic element and are exemplified by configurations including at least any one or more of Ta, W, Hf, Zr, Nb, Mo, Ru, V, and C.

The film thicknesses of the first non-magnetic insertion layer (3b) and the second non-magnetic insertion layer (5b) are adjusted to maintain magnetic coupling between the adjacent first divided magnetic layer (3a) and second divided magnetic layer (3c), and the adjacent third divided magnetic layer (5a) and fourth divided magnetic layer (5c), respectively. The thicknesses are preferably in the range of 0.1 nm to 2 nm, and more preferably 0.1 nm to 0.5 nm.

The total film thickness $t_1$ (nm) of the first divided magnetic layer (3a) and the second divided magnetic layer (3c) and the total film thickness $t_2$ (nm) of the third divided magnetic layer (5a) and the fourth divided mag-etic layer (5c) are formed to obtain the relationship of D<$t_1$ and D≤$t_2$ or the relationship of D≤$t_1$ and D<$t_2$ with the junction size D (nm) of the magnetoresistance effect element.

Where the relationship between the film thickness $t_1$, the film thickness $t_2$ and the junction size D is established, a perpendicular magnetic anisotropy is obtained with respect to the film surface, for example, even if the Junction size is 40 nm or less, 15 nm or less, or 10 nm or less.

The non-magnetic coupling layer (4) may be any one that enables anti-parallel coupling of the second divided magnetic layer (3c) and the third divided magnetic layer (5a). It is preferable that any one or more of Ru, Cu, Ir, Pd, Ta, W, Hf, Zr, Nb, Mo, V, and Cr and alloys thereof be included, Ru, Cu, Ir, Pd, Ta, and W are more preferable, and Ru is even more preferable.

The film thickness of the non-magnetic coupling layer (4) may be any within the range in which the second divided magnetic layer (3c) and the third divided magnetic layer (5a) are magnetically coupled in the anti-parallel direction, and may vary depending on the element configuration material and deposition conditions, but is exemplified by 0.1 nm to 2 nm, and preferably 0.3 nm to 1 nm. In the case of Ru, the antiferromagnetic coupling magnetic field has a peak near 0.4 nm or 0.9 nm, so it is desirable to adjust the film thickness to this vicinity.

Embodiment 10

Figure 10:
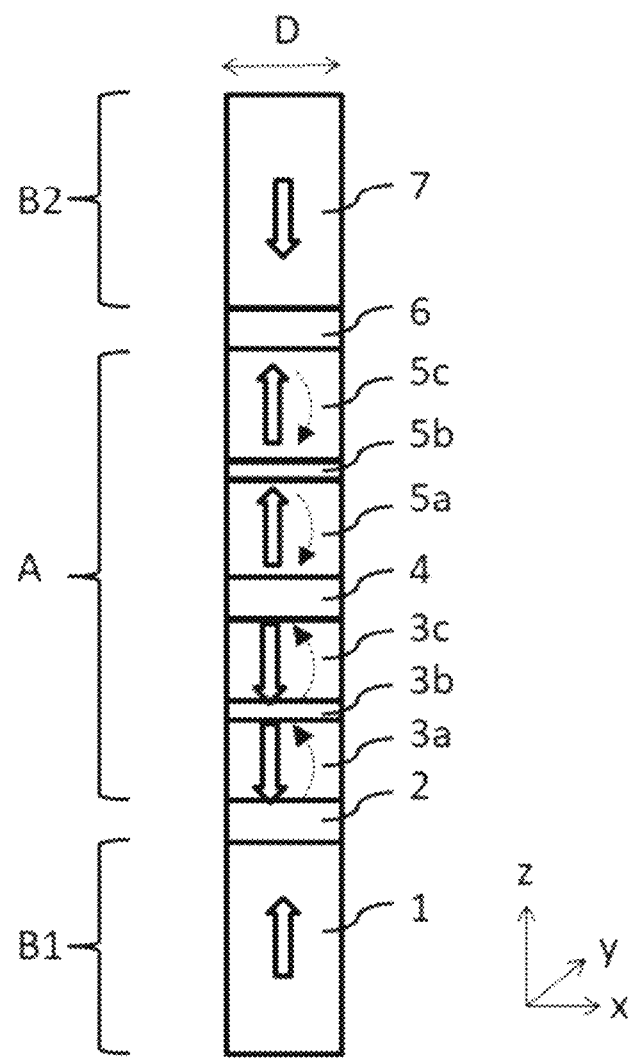
FIG. 10 is a longitudinal section view of another example of the configuration of the magnetoresistance effect element of the present invention.

FIG. 10 shows the basic configuration of Embodiment 10 of the present invention. In the basic configuration of the magnetoresistance effect element, the first reference layer (B1)/first non-magnetic layer (2)/first divided magnetic layer (3a)/first non-magnetic insertion layer (3b)/second divided magnetic layer (3c)/non-magnetic coupling layer (4)/third divided magnetic layer (5a)/second non-magnetic insertion layer (5b)/fourth divided magnetic layer (5c)/second non-magnetic layer (6)/second reference layer (B2) are arranged adjacent to each other in this order, and the first divided magnetic layer (3a)/first non-magnetic insertion layer (3b)/second divided magnetic layer (3c)/non-magnetic coupling layer (4)/third divided magnetic layer (5a)/second non-magnetic insertion layer (5b)/fourth divided magnetic layer (5) constitute the recording layer (A).

Embodiment 10 has the same features as those of Embodiments 1 and 9.

Embodiment 11

Figure 11:
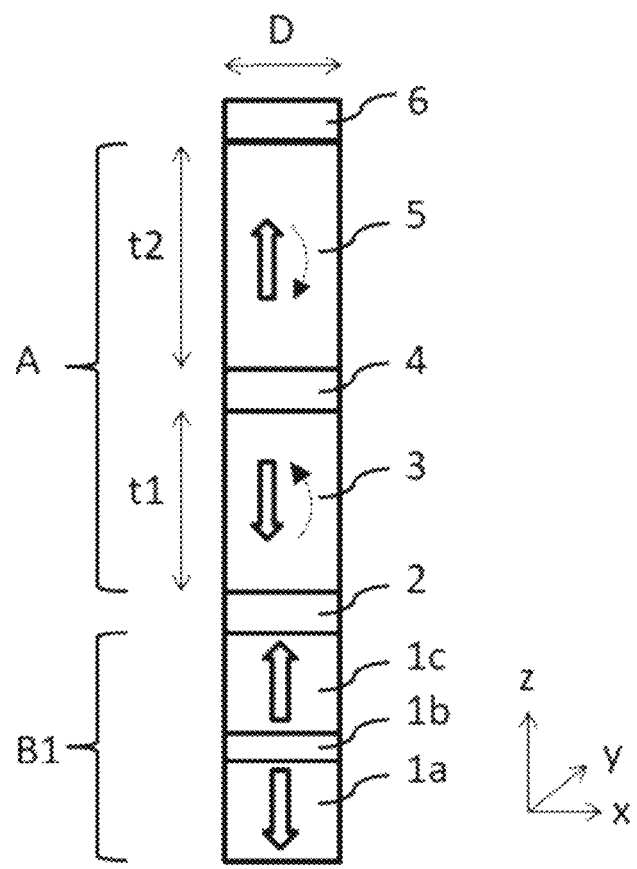
FIG. 11 is a longitudinal section view of another example of the configuration of the magnetoresistance effect element of the present invention.

FIG. 11 shows the basic configuration of Embodiment 11 of the present invention. In the basic configuration of the magnetoresistance effect element, a non-magnetic insertion layer (1b) and a magnetic layer (1a) are provided adjacent to each other in addition to the magnetic layer (1c) as the first reference layer (B1) of Embodiment 1.

Embodiment 11 has the same features as those of Embodiment 1 except for the following points.

The two magnetic layers (1a, 1c) are of a material including at least one 3d ferromagnetic transition metal element such as Co, Fe, Ni, Mn, and the like, and examples thereof include Co, Fe, CoFe, FeNi, CoNi, CoB, FeB, CoFeB, FePt, TbFeCo, MnAl and the like. Non-magnetic elements such as B, V, Ti, Cr, Zr, Nb, Mo, Hf, Ta, W, Si, Al, Pd, Pt, and the like may be further included.

The two magnetic layers (1a, 1c) each may be a single layer, or a laminated layer or multilayers, and may be laminated layers with Pt, Ru, W, Ni, and the like, thin layer ferri structures, or the like.

The magnetization directions of the two magnetic layers (1a and 1c) are fixed to the direction perpendicular to the film surface and are in the opposite directions (anti-parallel).

In this way, by setting the magnetization direction in the first reference layer (B1) to an anti-parallel coupled laminated layer structure, the magnetic field from the first reference layer (B1) can be weakened and thermal stability can be improved.

The non-magnetic insertion layer (1b) may be any one that magnetically couples the two adjacent magnetic layers (1a, 1c) in the anti-parallel direction. It is preferable that the non-magnetic insertion layer include any one of Ru, Cu, Ir, Pd, Ta, W, Hf, Zr, Nb, Mo, V, Cr or alloys thereof, and Ru, Cu, Ir, Pd, Ta and W are more preferable, and Ru is even more preferable.

The film thickness of the non-magnetic insertion layer (1b) may be any one that ensures that the two adjacent magnetic layers (1a, 1c) are magnetically coupled in the anti-parallel direction. The film thickness differs depending on the element configuration material and deposition conditions, but can be exemplified by 0.1 nm to 2 nm, and preferably 0.3 nm to 1 nm. In the case of Ru, the antiferromagnetic coupling has a peak value near 0.4 nm or 0.9 nm, so it is desirable to adjust the film thickness close to this value.

The configuration of the recording layer of Embodiment 11 is made the same as that of Embodiment 1, but the configurations of the recording layer of Embodiments 3 to 10 may be also adopted.

Embodiment 12

Figure 12:
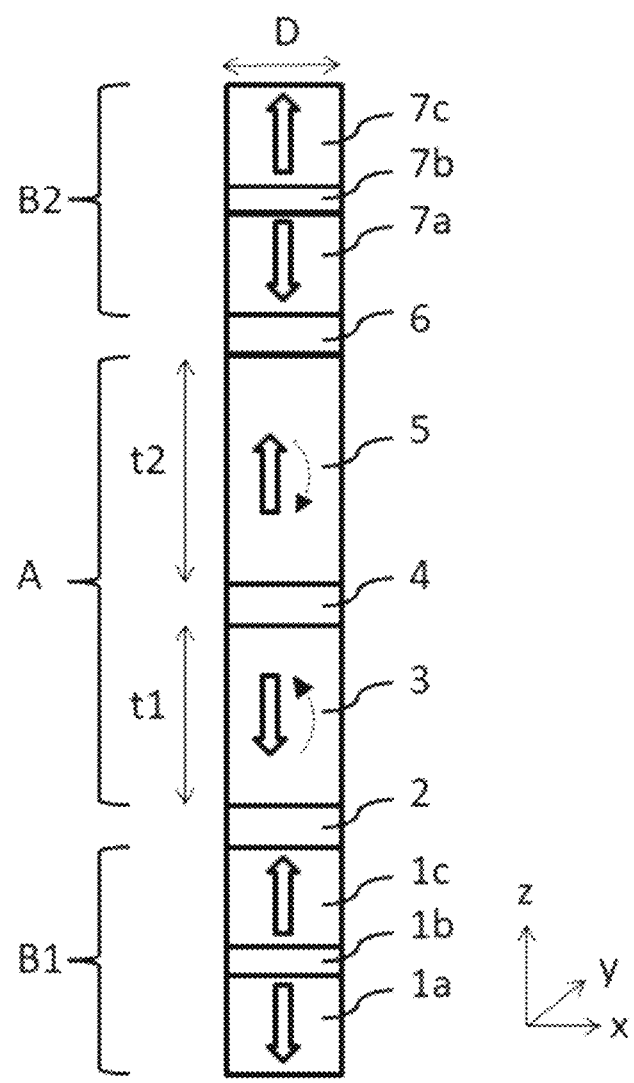
FIG. 12 is a longitudinal section view of another example of the configuration of the magnetoresistance effect element of the present invention.

FIG. 12 shows the basic configuration of Embodiment 12 of the present invention. In the basic configuration of the magnetoresistance effect element, a non-magnetic insertion layer (7b) and a magnetic layer (7c) are provided adjacent to each other in addition to the magnetic layer (7a) as the second reference layer (B2) of Embodiment 2.

Embodiment 12 has the same features as those of Embodiment 11 except for the following points.

The two magnetic layers (7a, 7c) are of a material including at least one 3d ferromagnetic transition metal element such as Co, Fe, Ni, Mn, and the like, and examples thereof include Co, Fe, CoFe, FeNi, CoNi, CoB, FeB, CoFeB, FePt, TbFeCo, MnAl and the like. Non-magnetic elements such as B, V, Ti, Cr, Zr, Nb, Mo, Hf, Ta, W, Si, Al, Pd, Pt, and the like may be further included.

The two magnetic layers (7a, 7c) each may be a single layer, or laminated layers or multilayers, and may be laminated layers with Pt, Ru, W, Ni, and the like, thin layer fermi structures, or the like.

The magnetization directions of the two magnetic layers (7a and 7c) are fixed to the direction perpendicular to the film surface and are in the opposite directions (anti-parallel). In FIG. 12, the magnetization directions of the magnetic layer (1c) as the first reference layer (B1) and the magnetic layer (7a) as the second reference layer (B2) are oriented toward the recording layer (A) side, and all the magnetic layers in the reference layers may be fixed in the direction opposite that shown in FIG. 12.

In this way, by setting the magnetization direction in the reference layers (B1, B2) to an anti-parallel coupled laminated layer structure, the magnetic field from the reference layers (B1, B2) can be weakened and thermal stability can be improved.

The non-magnetic insertion layer (7b) may be any one that magnetically couples the two adjacent magnetic layers (7a, 7c) in the anti-parallel direction. It is preferable that the non-magnetic insertion layer include any one of Ru, Cu, Ir, Pd, Ta, W, Hf, Zr, Nb, Mo, V, Cr or alloys thereof, and Ru, Cu, Ir, Pd, Ta and W are more preferable, and Ru is even more preferable.

The film thickness of the non-magnetic insertion layer (7b) may be any one that ensures that the two adjacent magnetic layers (7a, 7c) are magnetically coupled in the anti-parallel direction. The film thickness differs depending on the element configuration material and deposition conditions, but can be exemplified by 0.1 nm to 2 nm, and preferably 0.3 nm to 1 nm. In the case of Ru, the antiferromagnetic coupling has a peak value near 0.4 nm or 0.9 nm, so it is desirable to adjust the film thickness close to this value.

The configuration of the recording layer of Embodiment 12 is made the same as that of Embodiment 2, but the configurations of the recording layer of Embodiments 3 to 10 may be also adopted. Further, one reference layer may be replaced with a configuration fixed in one direction as in Embodiment 1.

Embodiment 13

Figure 13:
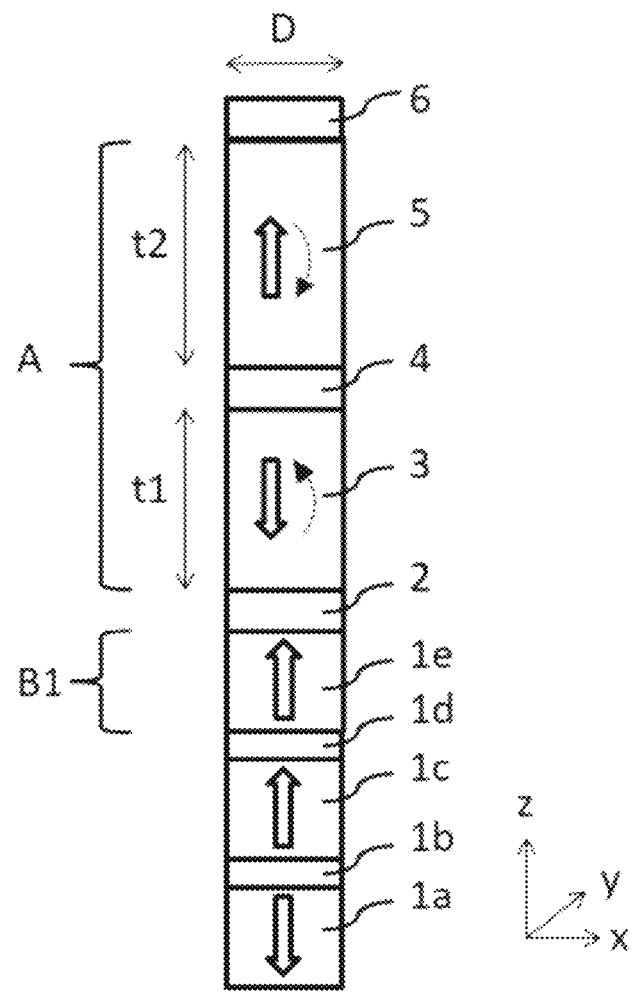
FIG. 13 is a longitudinal section view of another example of the configuration of the magnetoresistance effect element of the present invention.

FIG. 13 shows the basic configuration of Embodiment 13 of the present invention. In the basic configuration of the magnetoresistance effect element, a non-magnetic insertion layer (1d), the magnetic layer (1c), the non-magnetic insertion layer (1b), and the magnetic layer (1a) are provided adjacent to a magnetic layer (1e) to form the first reference layer (B1) of Embodiment 1.

Embodiment 13 has the same features as those of Embodiment 11 except for the following points.

The non-magnetic insertion layer (1d) includes a non-magnetic element and can be exemplified by a configuration including at least one or more elements of Ta, W, Hf, Zr, Nb, Mo, Ru, V, and C.

The film thickness of the non-magnetic insertion layer (1d) is adjusted so as to maintain a magnetic coupling with the two adjacent magnetic layers (1e, 1c). The film thickness is preferably in the range of 0.1 nm to 2 nm, and more preferably 0.1 nm to 0.5 nm.

The magnetic layer (1e) is of a material including at least one 3d ferromagnetic transition metal element such as Co, Fe, Ni, Mn, and the like, and examples thereof include Co, Fe, CoFe, FeNi, CoNi, CoB, FeB, CoFeB, FePt, TbFeCo, MnAl and the like. Non-magnetic elements such as B, V, Ti, Cr, Zr, Nb, Mo, Hf, Ta, W, Si, Al, Pd, Pt and the like may be further included.

The magnetic layer (1e) may be a single layer, or a laminated layer or a multilayer, and may be a laminated layer with t, Ru, W, Ni, and the like, a thin layer ferri structure, or the like.

The film thickness of the magnetic layer (1e) is adjusted to about 0.1 nm to 10 nm, depending on the material and layer configuration.

Of the three magnetic layers, the magnetization directions of the two magnetic layers (1e, 1c) have the same orientation.

The configuration of the recording layer of Embodiment 13 is made the same as that of Embodiment 1, but the configurations of the recording layer of Embodiments 2 to 10 may be also adopted.

Embodiment 14

Figure 14:
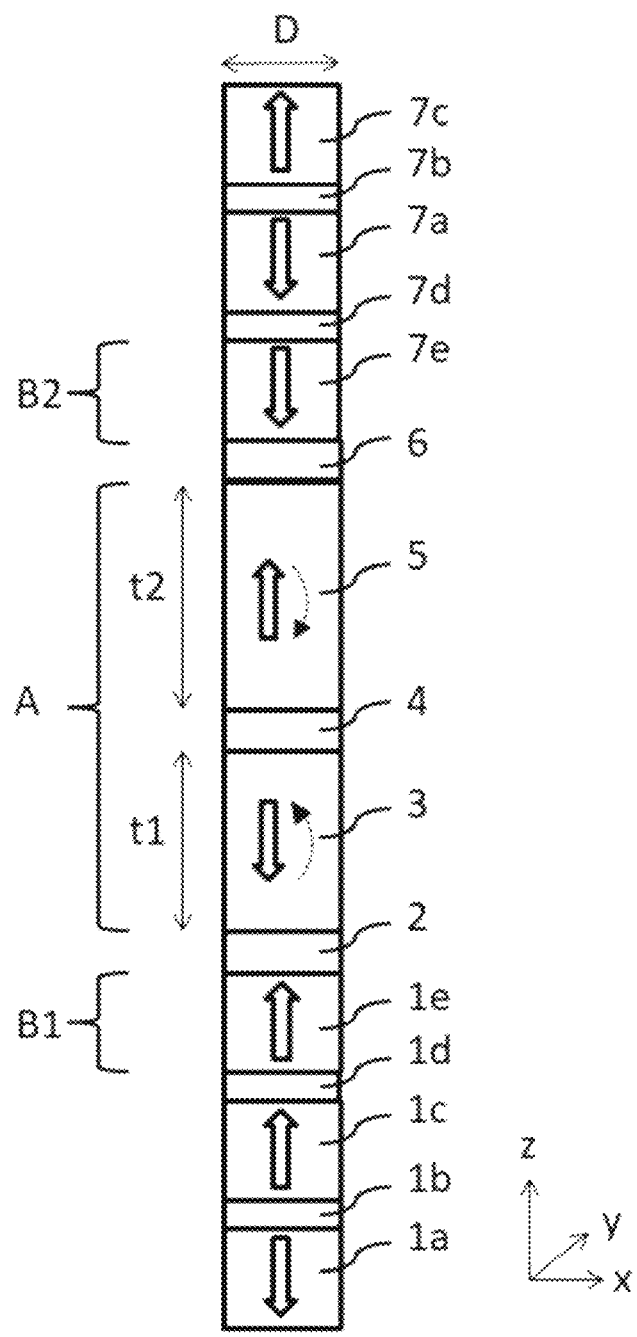
FIG. 14 is a longitudinal section view of another example of the configuration of the magnetoresistance effect element of the present invention.

FIG. 14 shows the basic configuration of Embodiment 14 of the present invention. In the basic configuration of the magnetoresistance effect element, the non-magnetic insertion layer (7d), the magnetic layer (7a), the non-magnetic insertion layer (7b) and the magnetic layer (7c) are provided adjacent to each other in addition to the magnetic layer (7e) serving as the second reference layer (B2) of Embodiment 2.

Embodiment 14 has the same features as those of Embodiment 13 except for the following points.

The non-magnetic insertion layer (7d) includes a non-magnetic element, and can be exemplified by a configuration including at least one or more elements of Ta, W, Hf, Zr, Nb, Mo, Ru, V, and C.

The film thickness of the non-magnetic insertion layer (7d) is adjusted so as to maintain a magnetic coupling with the two adjacent magnetic layers (7e, 7a). The film thickness is preferably in the range of 0.1 nm to 2 nm, and more preferably 0.1 nm to 0.5 nm.

The magnetic layers (7e, 7a) are of a material including at least one 3d ferromagnetic transition metal element such as Co, Fe, Ni, Mn, and the like, and examples thereof include Co, Fe, CoFe, FeNi, CoNi, CoB, FeB, NiB, CoFeB, FePt, TbFeCo, MnAl and the like. Non-magnetic elements such as B, V, Ti, Cr, Zr, Nb, Mo, Hf, Ta, W, Si, Al, Pd, Pt, and the like may be further included.

The magnetic layers (7e, 7a) may be single layer, laminated layers or multilayers, or may be laminated layers with Pt, Ru, W, Ni, and the like, thin layer ferri structures, or the like.

Of the three magnetic layers, the magnetization directions of the two magnetic layers (7e, 7a) have the same orientation.

The configuration of the recording layer of Embodiment 14 is made the same as that of Embodiment 2, but the configurations of the recording layer of Embodiments 2 to 10 may be also adopted. Further, one reference layer may be replaced with the configuration of the reference layers of Embodiments 2 and 12.

Embodiment 15

Figure 15:
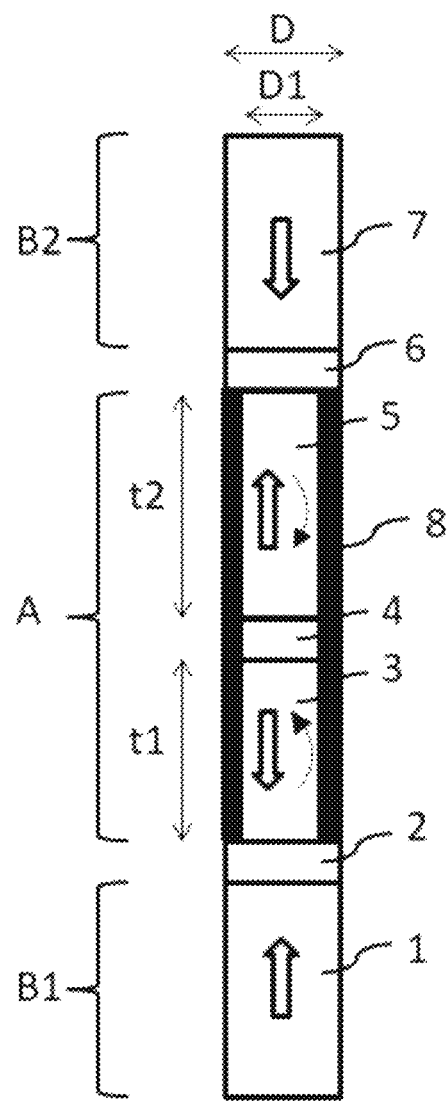
FIG. 15 is a longitudinal section view of another example of the configuration of the magnetoresistance effect element of the present invention.

FIG. 15 shows the basic configuration of Embodiment 15 of the present invention. The basic configuration of the magnetoresistance effect element has the same features as those of Embodiment 2 except for the following points.

The recording layer (A) includes a non-magnetic film (8) in the peripheral part. The non-magnetic film (8) can be obtained by oxidizing or nitriding the surface of the recording layer (A), and the diameter of the portion having the magnetic property of the recording layer (A) can be physically reduced.

In this case, the effective diameter Dl of the portion having the magnetic properties of the element is smaller than the effective diameter D1, and the film thickness $t_1$ (nm) of the first magnetic layer (3) and the film thickness $t_1$ (nm) of the second magnetic layer (5) are formed such as to have the relationships of $D1 < t_1$ and $D1 \leq t_2$ or $D1 \leq t_1$ and $D1 < t_2$ with the effective diameter D1 (nm). Further, since the non-magnetic film (8) is obtained by oxidizing and nitriding the peripheral part of the laminated recording layer (A), the effective diameter D1 is in the range of 0<D1<D.

Therefore, in Embodiment 15, the film thickness $t_1$ (nm) and the film thickness $t_2$ (nm) can be made smaller, and the element size can be further reduced.

Figure 16:
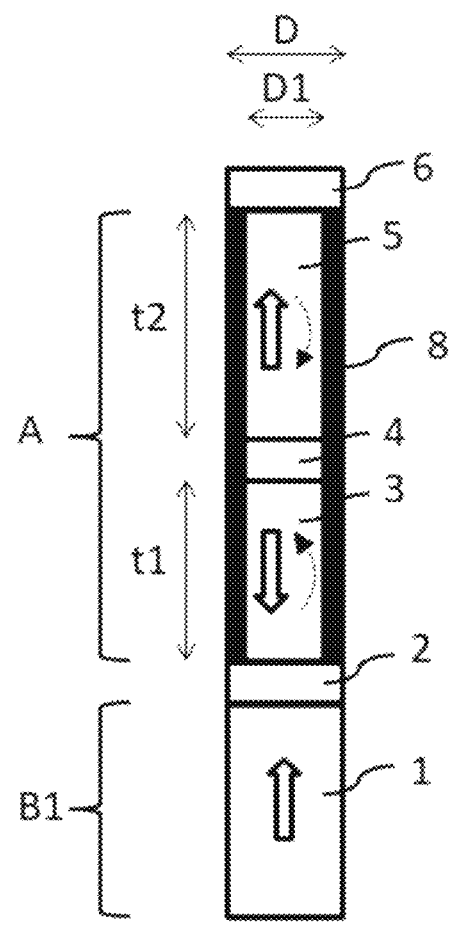
FIG. 16 is a longitudinal section view of another example of the configuration of the magnetoresistance effect element of the present invention.

As shown in FIG. 16, one of the configurations of Embodiment 15 may be obtained by removing the second reference layer (B2). Since the shape magnetic anisotropy is provided in the perpendicular direction and the two magnetic layers can be magnetically coupled in the anti-parallel direction, the thermal stability factor Δ can be increased.

Figure 17:
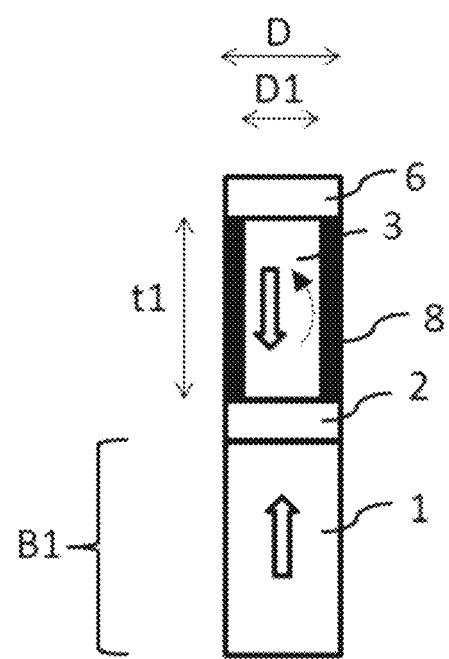
FIG. 17 is a longitudinal section view of another example of the configuration of the magnetoresistance effect element of the present invention.

Further, as shown in FIG. 17, one of the configurations of Embodiment 15 may be only the basic structure of the magnetic tunnel junction including the first reference layer (B1), the first non-magnetic layer (2), the first magnetic layer (3), and a second non-magnetic layer (6) that functions as a cap layer. Since the shape magnetic anisotropy is provided in the perpendicular direction, the thermal stability factor Δ can be increased even if the element size becomes small.

The configuration of Embodiment 15 other than the non-magnetic film (8) is made the same as that of Embodiment 2, but the configurations of Embodiments 4 to 14 may also be adopted.

Embodiment 16

Figure 18:
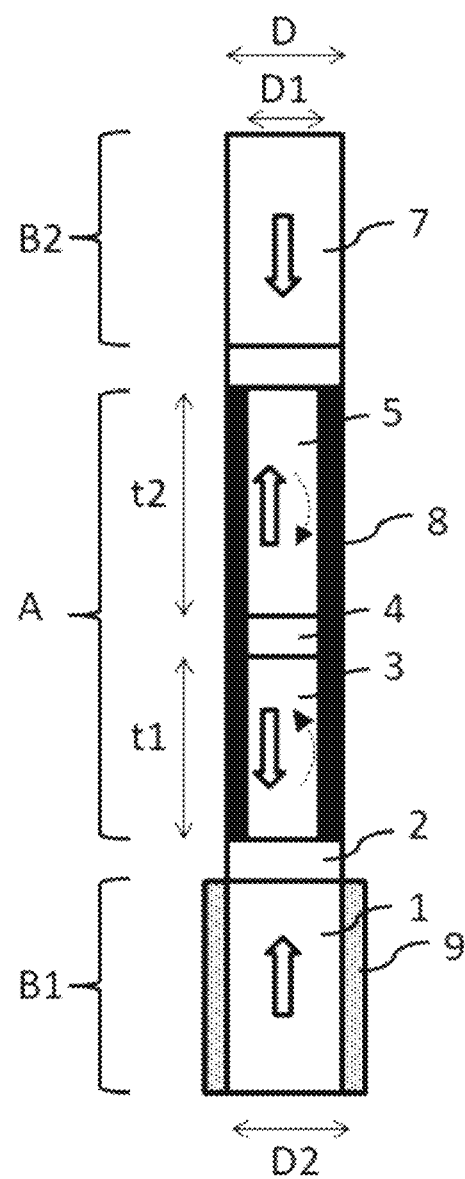
FIG. 18 is a longitudinal section view of another example of the configuration of the magnetoresistance effect element of the present invention.

FIG. 18 shows the basic configuration of Embodiment 16 of the present invention. The basic configuration of the magnetoresistance effect element has the same features as those of Embodiment 15 except for the following points.

Thea first reference layer (B1) additionally has a side wall (9). The side wall (9) is provided to prevent the deterioration of the first reference layer (B1) when the non-magnetic film (8) is provided, and a material such as SiN, $Al_2O_3$, SiCN, and the like is used for the side wall. The xy-axial direction thickness of the side wall (9) is adjusted in the range of 1 nm to 30 nm.

Further, by providing the side wall (9), the distance between the end of the element on the reference layer side and the end of the recording layer is increased, and the stray magnetic field from the reference layer side can be reduced.

Figure 19:
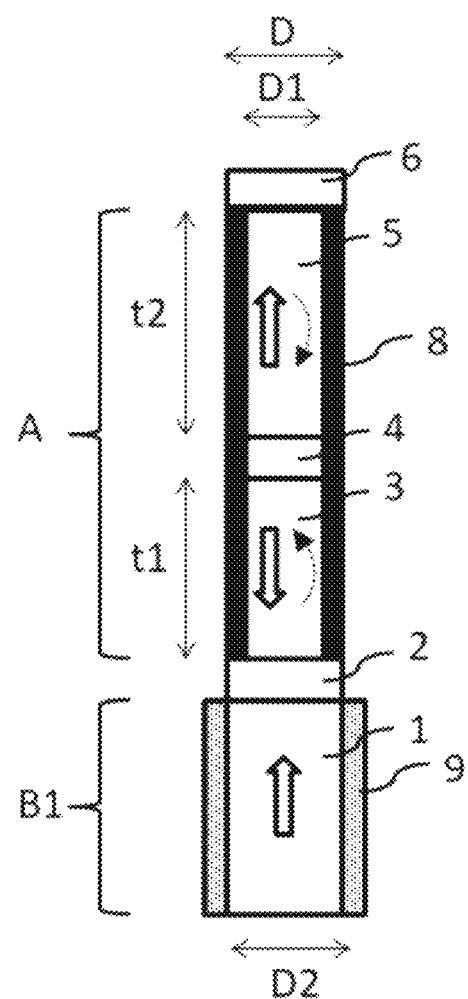
FIG. 19 is a longitudinal section view of another example of the configuration of the magnetoresistance effect element of the present invention.
Figure 20:
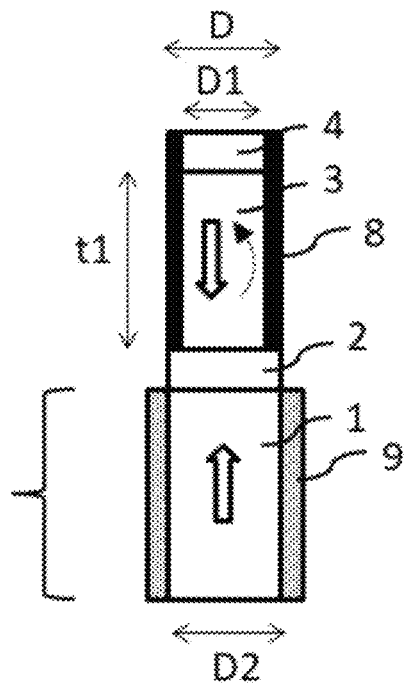
FIG. 20 is a longitudinal section view of another example of the configuration of the magnetoresistance effect element of the present invention.

As shown in FIG. 19, the configuration of FIG. 16 may be also provided with the side wall (9), or as shown in FIG. 20, the configuration of FIG. 17 may be also provided with the side wall (9). Further, although the configuration of the Embodiment 16 other than the side wall (9) is made the same as that of Embodiment 15, the configurations of the 2nd to 14th embodiments may also be adopted.

Further, the magnetoresistance effect element of the present invention can reduce the stray magnetic field even when the junction size is 15 nm or less and the element spacing (corresponding to S in FIG. 21) is 15 nm or less, and even a small element has high thermal stability due to the effect of shape anisotropy. In the magnetoresistance effect element of the present invention, which is not easily affected by the stray magnetic field, the stray magnetic field is small and thermal stability is high despite high integration, so that the influence on the adjacent element is reduced.

The layer configurations shown in each embodiment may be arranged adjacently in order, and no limitation is placed on the laminated layer method, laminated layer order, vertical and horizontal orientations, and the like.

REFERENCE SIGNS LIST

B1 first reference layer
1, 1a, 1c, 1e magnetic layer
1b, 1d non-magnetic insertion layer
2 first non-magnetic layer
A recording layer
3 first magnetic layer
3a first divided magnetic layer
3b first non-magnetic insertion layer
3c second divided magnetic layer
4 non-magnetic coupling layer
5 second magnetic layer
5a third divided magnetic layer
5b second non-magnetic insertion layer
5c fourth divided magnetic layer
6 second non-magnetic layer
B2 second reference layer
7, 7a, 7c, 7e magnetic layer
7b, 7d non-magnetic insertion layer
8 non-magnetic film
9 side wall

The invention claimed is:

1. A magnetic memory in which an element spacing between magnetoresistance effect elements is 15 nm or less, the magnetoresistance effect element comprising:
   a first reference layer (B1);
   a first non-magnetic layer (2) provided adjacent to the first reference layer (B1);
   a first magnetic layer (3) provided adjacent to an opposite side of the first non-magnetic layer (2) to the first reference layer (B1);
   a non-magnetic coupling layer (4) provided adjacent to an opposite side of the first magnetic layer (3) to the first non-magnetic layer (2);
   a second magnetic layer (5) provided adjacent to an opposite side of the non-magnetic coupling layer (4) to the first magnetic layer (3); and
   a second non-magnetic layer (6) provided adjacent to an opposite side of the second magnetic layer (5) to the non-magnetic coupling layer (4), wherein
   the first reference layer (B1) includes a ferromagnetic substance and has a magnetization direction fixed to a direction perpendicular to a film surface,
   the first magnetic layer (3) and the second magnetic layer (5) each include a ferromagnetic substance, have a magnetization direction variable to the direction perpendicular to a film surface and are magnetically coupled in an anti-parallel direction, and
   a junction size D (nm), which is a length of the longest straight line on an end face perpendicular to each thickness direction of the first magnetic layer (3) and the second magnetic layer (5), a film thickness $t_1$ (nm) of the first magnetic layer (3), and a film thickness $t_2$ (nm) of the second magnetic layer (5) satisfy relationships $D<t_1$ and $D≤t_2$, or $D≤t_1$ and $D<t_2$.

2. The magnetic memory according to claim 1, wherein the magnetoresistance effect element further comprises a second reference layer (B2) provided adjacent to an opposite side of the second non-magnetic layer (6) to the second magnetic layer (5), wherein
   the second reference layer (B2) includes a ferromagnetic substance and has a magnetization direction fixed to the direction perpendicular to a film surface, and the magnetization direction of the first reference layer (B1) and the magnetization direction of the second reference layer (B2) are opposite to each other.

3. The magnetic memory according to claim 1, wherein the first non-magnetic layer (2) and the second non-magnetic layer (6) each include O.

4. The magnetic memory according to claim 1, wherein the non-magnetic coupling layer (4) includes any one or more of Ru, Cu, Ir, Pd, Ta, W, or alloys thereof.

5. The magnetic memory according to claim 4, wherein the non-magnetic coupling layer (4) is Ru and a film thickness thereof is close to 0.4 nm or 0.9 nm.

6. The magnetic memory according to claim 1, wherein the junction size D is 40 nm or less.

7. The magnetic memory according to claim 1, wherein the film thickness $t_1$ (nm) of the first magnetic layer (3) and the film thickness $t_2$ (nm) of the second magnetic layer (5) is 15 nm or less.

8. The magnetic memory according to claim 1, wherein the film thickness of the first non-magnetic layer (2) and the film thickness of the second non-magnetic layer (6) are different.

9. The magnetic memory according to claim 1, wherein the first magnetic layer (3) includes a first divided magnetic layer (3a), a first non-magnetic insertion layer (3b), and a second divided magnetic layer (3c), the first divided magnetic layer (3a) being provided adjacent to the first non-magnetic layer (2) and the first non-magnetic insertion layer (3b), the first non-magnetic insertion layer (3b) being provided adjacent to the first divided magnetic layer (3a) and the second divided magnetic layer (3c), and the second divided magnetic layer (3c) being provided adjacent to the first non-magnetic insertion layer (3b) and the non-magnetic coupling layer (4), the second magnetic layer (5) includes a third divided magnetic layer (5a), a second non-magnetic insertion layer (5b), and a fourth divided magnetic layer (5c), the third divided magnetic layer (5a) being provided adjacent to the non-magnetic coupling layer (4) and the second non-magnetic insertion layer (5b), the second non-magnetic insertion layer (5b) being provided adjacent to the third divided magnetic layer (5a) and the fourth divided magnetic layer (5c), and the fourth divided magnetic layer (5c) being provided adjacent to the second non-magnetic insertion layer (5b) and the second non-magnetic layer (6), the first divided magnetic layer (3a), the second divided magnetic layer (3c), the third divided magnetic layer (5a), and the fourth divided magnetic layer (5c) include at least any of Co and Fe, the first divided magnetic layer (3a) and the second divided magnetic layer (3c) are magnetically coupled in a parallel direction, the third divided magnetic layer (5a) and the fourth divided magnetic layer (5c) are magnetically coupled in a parallel direction, and the second divided magnetic layer (3c) and the third divided magnetic layer (5a) are magnetically coupled in an anti-parallel direction.

10. The magnetic memory according to claim 9, wherein a ratio of an Fe composition of the first divided magnetic layer (3a) to an Fe composition of the second divided magnetic layer (3c) is greater than 1, or a ratio of a Co composition of the first divided magnetic layer (3a) to a Co composition of the second divided magnetic layer (3c) is less than 1, and a ratio of an Fe composition of the fourth divided magnetic layer (5c) to an Fe composition of the third divided magnetic layer (5a) is greater than 1, or a ratio of a Co composition of the fourth divided magnetic layer (5c) to a Co composition of the third divided magnetic layer (5a) is less than 1.

11. The magnetic memory according to claim 1, wherein a non-magnetic film (8) is included in a peripheral part of each of the first magnetic layer (3), the non-magnetic coupling layer (4), and the second magnetic layer (5).

12. The magnetic memory according to claim 11, wherein in the magnetoresistance effect element, a side wall (9) is further provided on a periphery of the first reference layer (B1).

* * * * *